(12) United States Patent
Li et al.

(10) Patent No.: US 11,610,869 B2
(45) Date of Patent: Mar. 21, 2023

(54) DISPLAY DEVICE AND TILED DISPLAY DEVICE HAVING THE SAME

(71) Applicant: Samsung Display Co., Ltd., Yongin-si (KR)

(72) Inventors: Xinxing Li, Yongin-si (KR); Sung Kook Park, Yongin-si (KR); Kang Young Lee, Yongin-si (KR); Hyun Min Cho, Yongin-si (KR); Chang Il Tae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 168 days.

(21) Appl. No.: 17/248,422

(22) Filed: Jan. 25, 2021

(65) Prior Publication Data
US 2021/0327857 A1    Oct. 21, 2021

(30) Foreign Application Priority Data

Apr. 21, 2020    (KR) .................... 10-2020-0048139

(51) Int. Cl.
    *H01L 25/075*    (2006.01)
    *H01L 27/12*     (2006.01)
    *H01L 33/50*     (2010.01)

(52) U.S. Cl.
    CPC ........ *H01L 25/0753* (2013.01); *H01L 27/124* (2013.01); *H01L 33/502* (2013.01)

(58) Field of Classification Search
    None
    See application file for complete search history.

(56) References Cited

U.S. PATENT DOCUMENTS

| | | |
|---|---|---|
| 5,805,117 A | 9/1998 | Mazurek et al. |
| 7,592,971 B2 | 9/2009 | Chang et al. |
| 8,872,214 B2 | 10/2014 | Negishi et al. |
| 9,287,242 B2 | 3/2016 | Shibata et al. |
| 9,570,425 B2 | 2/2017 | Do |
| 9,773,761 B2 | 9/2017 | Do |
| 2011/0089850 A1 | 4/2011 | Shibata et al. |
| 2018/0012876 A1 | 1/2018 | Kim et al. |
| 2019/0244976 A1 | 8/2019 | Zhu |
| 2021/0202657 A1* | 7/2021 | Cho ..................... G09G 3/3233 |
| 2021/0376040 A1* | 12/2021 | Youn ................... H01L 27/3262 |

FOREIGN PATENT DOCUMENTS

| | | |
|---|---|---|
| CN | 108122497 A | 6/2018 |
| JP | 2002-297066 A | 10/2002 |
| JP | 4814394 B2 | 11/2011 |
| JP | 4914929 B2 | 4/2012 |

(Continued)

*Primary Examiner* — Bo B Jang
(74) *Attorney, Agent, or Firm* — Lewis Roca Rothgerber Christie LLP

(57) ABSTRACT

A display device includes a substrate including a display unit including a plurality of pixels and a protrusion protruding from an edge of the display unit, the plurality of pixels including a first pixel on an outermost region of the display unit and a second pixel adjacent to the first pixel; a driver on the protrusion; and a fan-out line to electrically connect the first pixel and the driver, wherein at least a portion of the fan-out line is on the display unit between the first pixel and the second pixel in a plan view.

20 Claims, 23 Drawing Sheets

(56) References Cited

FOREIGN PATENT DOCUMENTS

| | | | |
|---|---|---|---|
| KR | 0164360 | B1 | 3/1999 |
| KR | 10-0537021 | B1 | 2/2006 |
| KR | 10-0568014 | B1 | 6/2006 |
| KR | 10-0570507 | B1 | 9/2006 |
| KR | 10-0576118 | B1 | 9/2006 |
| KR | 10-0623944 | B1 | 9/2006 |
| KR | 10-0628435 | B1 | 12/2006 |
| KR | 10-0666137 | B1 | 6/2007 |
| KR | 10-0902013 | B1 | 6/2009 |
| KR | 10-1015275 | B1 | 2/2011 |
| KR | 10-1157425 | B1 | 6/2012 |
| KR | 10-1436123 | B1 | 11/2014 |
| KR | 10-1490758 | B1 | 2/2015 |
| KR | 10-2018-0007025 | A | 1/2018 |

* cited by examiner

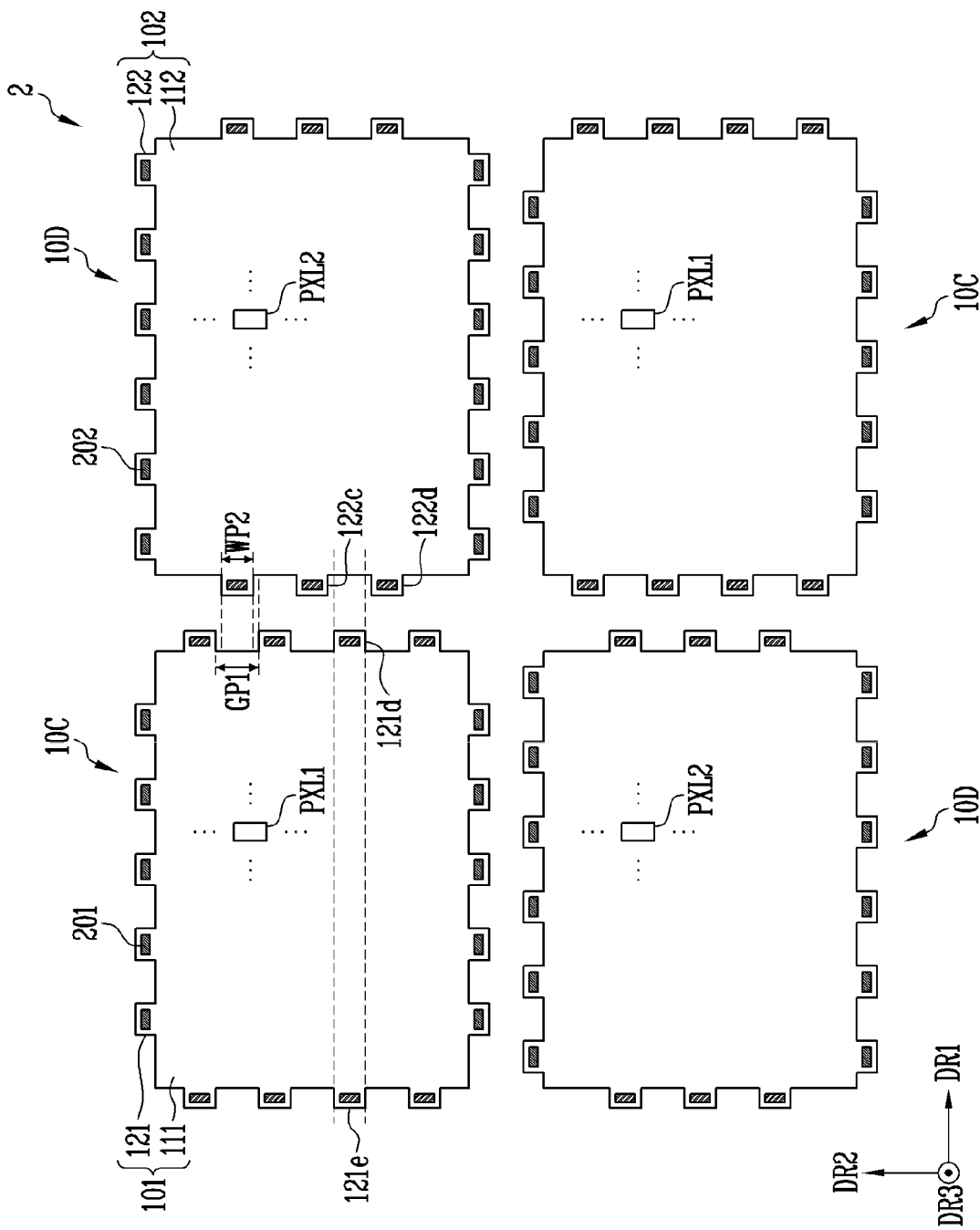

DISPLAY DEVICE AND TILED DISPLAY DEVICE HAVING THE SAME

CROSS-REFERENCE TO RELATED APPLICATION

This application claims priority to and the benefit of Korean Patent Application No. 10-2020-0048139, filed on Apr. 21, 2020, the content of which in its entirety is herein incorporated by reference.

BACKGROUND

1. Field

The disclosure relates to a display device and a tiled display device having the same.

2. Description of the Related Art

A display device may display an image by using a light emitting element such as a light emitting diode as a light source of a pixel. The light emitting diode exhibits relatively excellent durability even in a poor environmental condition, and also exhibits excellent performance in terms of a life and a luminance. Research has been conducted for manufacturing a light emitting diode by using a material of an inorganic crystal structure having high reliability and using the light emitting diode as a pixel light source by disposing the light emitting diode on a display panel of a display device.

For example, in a case of a tiled display device including a plurality of display panels, a seam area (or a non-display area) between the display panels may be recognized by a user. Therefore, the display panels may be recognized as screens separated from each other, and the degree of immersion into the image by the user may be disturbed. Accordingly, a display device with a reduced or minimized seam area may be desired.

SUMMARY

One or more aspects of the present disclosure is to provide a display device with a reduced or minimized non-display area.

Another aspect of the present disclosure is to provide a tiled display device capable of providing an immersive image with a reduced or minimized seam area between the display panels.

The one or more aspects of the present disclosure are not limited to the above-described aspects, and other technical problems which are not described will be clearly understood by those skilled in the art from the following description.

A display device according to one or more embodiments of the present disclosure includes a substrate including a display unit including a plurality of pixels and a protrusion protruding from an edge of the display unit, the plurality of pixels including a first pixel on an outermost region of the display unit, a second pixel adjacent to the first pixel, a driver on the protrusion, and a fan-out line to electrically connect the first pixel and the driver, where at least a portion of the fan-out line is on the display unit between the first pixel and the second pixel in a plane view.

The fan-out line may include a first line portion connected to the first pixel, a second line portion connected to the first line portion and located between the first pixel and the second pixel, and a third line portion connected to the second line portion and the driver.

The driver may be configured to provide a first signal to the first pixel through the fan-out line, the first pixel may be connected to the second pixel through a first signal line, and the second pixel may be configured to receive the first signal through the first signal line.

The first line portion and the third line portion may extend in a same direction as the first signal line.

The driver may be a scan driver or a data driver, and the first pixel may emit light according to the first signal from the driver.

The first line portion and the third line portion may be at a same layer, and the second line portion may be at a layer different from the first line portion and the third line portion.

The display device may further include an insulating layer on the first line portion and the third line portion, and the second line portion may be on the insulating layer.

The insulating layer may include a first contact hole exposing at least a portion of the first line portion and a second contact hole exposing at least a portion of the third line portion, and the second line portion may be connected to the first line portion through the first contact hole, and may be connected to the third line portion through the second contact hole.

Each of the pixels may include a first electrode and a second electrode located at a same layer and spaced from each other, and a light emitting element located between the first electrode and the second electrode.

The pixels may further include a wavelength conversion layer on the light emitting element, and a color filter layer on the wavelength conversion layer, where the wavelength conversion layer may include a wavelength conversion particle and a scattering particle.

A tiled display device according to one or more example embodiments includes first display panels and second display panels arranged alternately with each other in a first direction and a second direction crossing the first direction. Each of the first display panels includes a first substrate including a first display unit and a plurality of first protrusions protruding from an edge of the first display unit, the plurality of first protrusions being spaced at a first distance from each other, a first pixel in the first display unit, first panel drivers at the first protrusions, and a first fan-out line located in the first display unit to electrically connect the first pixel and one of the first panel drivers, each of the second display panels includes a second substrate including a second display unit and a plurality of second protrusions protruding from an edge of the second display unit, the plurality of second protrusions being spaced at a second distance from each other, a second pixel in the second display unit, second panel drivers at the second protrusions, and a second fan-out line located in the second display unit to electrically connect the second pixel and one of the second panel drivers, the first protrusions protruding from a side surface adjacent to the second display panels from among the plurality of first protrusions include a bent portion located under the second display unit. The second protrusions protruding from a side surface adjacent to the first display panels from among the plurality of second protrusions include a bent portion located under the first display unit.

Each of the first display panels may further include a third pixel located in the first display unit, the first fan-out line may include a first line portion connected to the first pixel, a second line portion connected to the first line portion and located between the first pixel and the third pixel, and a third line portion connected to the second line portion and one of the first panel drivers.

A first panel driver from among the first panel drivers may be configured to provide a first signal to the first pixel through the first fan-out line, and the first pixel may be connected to the third pixel through a first signal line, and may be configured to transfer the first signal to the third pixel through the first signal line.

The first line portion and the third line portion may be at a same layer, and the second line portion may be at a layer different from the first line portion and the third line portion.

Each of the first pixel and the second pixel may include a first electrode and a second electrode located at the same layer and spaced from each other, and a light emitting element located between the first electrode and the second electrode.

The tiled display device may further include a black matrix panel on each of the first display panels and the second display panels, the black matrix panel may include a black matrix overlapping a seam area between the first display unit and the second display unit in a third direction crossing the first direction and the second direction, and a width of the black matrix may be greater than a width of the seam area.

The first substrate may include a first side surface and a second side surface opposite to each other in the first direction, the first protrusions protruding from the first side surface may not overlap with the first protrusions protruding from the second side surface, in the first direction, the second substrate may include a third side surface adjacent to the first side surface of the first substrate and opposite to the first side surface in the first direction, and the second protrusions protruding from the third side surface may not overlap with the first protrusions protruding from the first side surface, in the first direction.

A shape of the second substrate of each of the second display panels may be the same as a shape of the first substrate of each of the first display panels.

The first substrate may include a first side surface and a second side surface opposite to each other in the first direction, the first protrusions protruding from the first side surface may overlap with the first protrusions protruding from the second side surface, in the first direction, the second substrate may include a third side surface adjacent to the first side surface and opposite to the first side surface in the first direction, and the second protrusions protruding from the third side surface may not overlap with the first protrusions protruding from the first side surface, in the first direction.

A gap between the first protrusions may be greater than a width of each of the second protrusions, and a gap between the second protrusions may be greater than a width of each of the first protrusions.

Specific details of other embodiments are included in the detailed description and drawings.

According to one or more embodiments of the present disclosure, in the display device, the fan-out line for connecting the pixel and the driver may be located between the pixels of the display unit. Accordingly, a separate space to form the fan-out line around the display unit may not be needed, and the area of a non-display area may be reduced or minimized. The display device may secure a wide display area and provide a more immersive image to a user.

According to one or more embodiments of the tiled display device of the present disclosure, in an area where the first display panel and the second display panel are adjacent to each other, the first protrusion of the first display panel is bent and is disposed under the second display unit of the second display panel, and the second protrusion of the second display panel is bent and is disposed under the first display unit of the first display panel. Accordingly, a space for the first panel driver and the second panel driver may not be visible to the user, and the width of the seam area between the first display panel and the second display panel may be reduced or minimized. As the width of the seam area is reduced or minimized, the tiled display device in which a plurality of first display panels and second display panels are arranged may be recognized as one panel rather than separated display panels, and may provide a more immersive image to the user.

The effects of the embodiments according to the present disclosure are not limited by the foregoing, and other various effects may be included in or realized by one or more embodiments according to the present disclosure.

BRIEF DESCRIPTION OF THE DRAWINGS

The above and other features of the disclosure will become more apparent by describing in further detail embodiments thereof with reference to the accompanying drawings, in which:

FIG. 21 is an exploded plan view of a tiled display device according to another example embodiment of the present disclosure.

DETAILED DESCRIPTION

Figure 1:
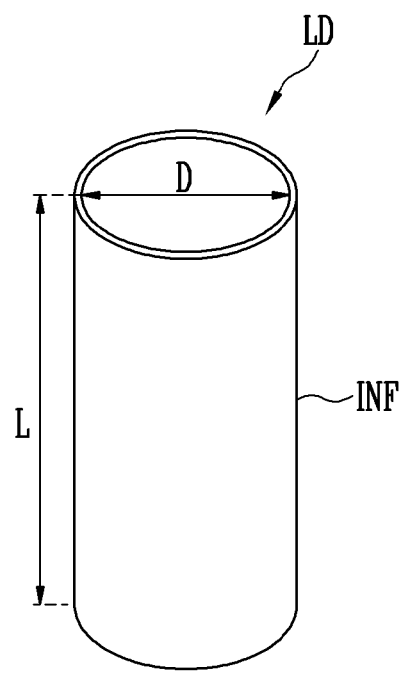
FIGS. 1 and 2 are a perspective view and a cross-sectional view illustrating a light emitting element according to one or more example embodiments.

The features and aspects of the present disclosure and a method of achieving them will become apparent with reference to example embodiments described in detail below together with the accompanying drawings. However, the disclosure is not limited to the embodiments disclosed below, and may be implemented in various different forms. The example embodiments are provided so that the disclosure will be thorough and complete and those skilled in the art to which the disclosure pertains can fully understand the scope of the disclosure. The disclosure is only defined by the scope of the claims.

A case in which an element or a layer is referred to as "on" another element or layer includes a case in which another layer or another element is disposed directly on the other element or between the other layers. A shape, a size, a ratio, an angle, the number, and the like disclosed in the drawings for describing the embodiments are examples, and thus, the disclosure is not limited thereto. The same reference numerals denote to the same components throughout the specification. In addition, parts unrelated to the disclosure in the drawings may be omitted or simply expressed in order to clarify the description of the disclosure.

Although a first, a second, and the like are used to describe various components, these components are not limited by these terms. These terms are used only to distinguish one component from another component. Therefore, a first component mentioned below may be a second component within the technical spirit of the disclosure. Singular expressions include plural expressions unless the context clearly indicates otherwise.

Each features of various embodiments of the disclosure may be coupled or combined with each other in part or in whole, and technically various interlocking and driving are possible. Each embodiment may be implemented independently of each other and association thereof may be implemented together.

Hereinafter, embodiments of the disclosure will be described in detail with reference to the accompanying drawings.

Figure 2:
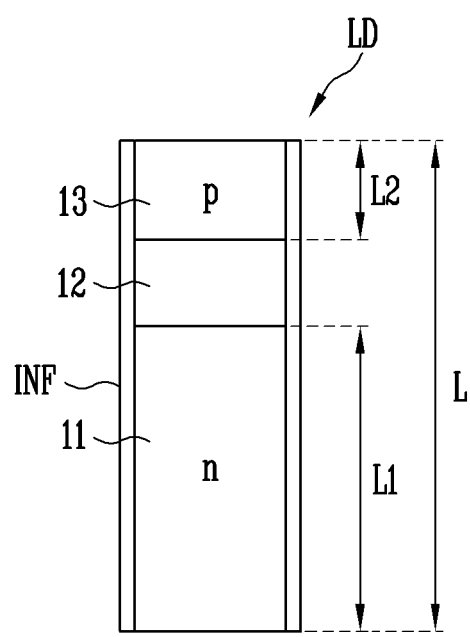

FIGS. 1 and 2 are a perspective view and a cross-sectional view illustrating a light emitting element according to one or more embodiments. Although a rod-shaped light-emitting element LD having a cylindrical shape is shown in FIGS. 1 and 2, a type and/or a shape of the light emitting element LD according to the disclosure is not limited thereto.

Referring to FIGS. 1 and 2, the light emitting element LD may include a first semiconductor layer 11, a second semiconductor layer 13, and an active layer 12 interposed between the first semiconductor layer 11 and the second semiconductor layer 13. For example, the light emitting element LD may be formed as a stack structure in which the first semiconductor layer 11, the active layer 12, and the second semiconductor layer 13 are sequentially stacked along one direction.

According to one or more example embodiments, the light emitting element LD may be provided in a rod shape extending along one direction. The light emitting element LD may have one end portion and another end portion along the one direction.

According to one or more example embodiments, one of the first semiconductor layer 11 and the second semiconductor layer 13 may be disposed at the one end portion of the light emitting element LD, and the other one of the first semiconductor layer 11 and the second semiconductor layer 13 may be disposed at the other end portion of the light emitting element LD.

According to one or more example embodiments, the light emitting element LD may be a rod-shaped light emitting diode manufactured in a rod shape. Here, the rod shape encompasses a rod-like shape or a bar-like shape that is longer in a longitudinal direction than a width direction (e.g., an aspect ratio of the rod-shaped light emitting diode is greater than 1), such as, a cylinder or polygonal column, and the shape of a cross section thereof is not particularly limited. For example, a length L of the light emitting element LD may be greater than a diameter D (or a width of the cross section) thereof.

According to one or more example embodiments, the light emitting element LD may have a size as small as nano-scale to micro-scale, for example, the diameter D and/or the length L of a range of about 100 nm to about 10 μm. However, the size of the light emitting element LD is not limited thereto. For example, the size of the light emitting element LD may be variously changed according to design condition of various devices using the light emitting element LD as a light source, for example, a display device or the like.

The first semiconductor layer 11 may include at least one n-type semiconductor material. For example, the first semiconductor layer 11 may include one semiconductor material from among InAlGaN, GaN, AlGaN, InGaN, AlN, and InN, and may include an n-type semiconductor material doped with a first conductive dopant such as Si, Ge, or Sn. However, the material configuring the first semiconductor layer 11 is not limited thereto, and various materials other than the materials described above may also configure the first semiconductor layer 11.

The active layer 12 may be formed on the first semiconductor layer 11 and may be formed of a single or multi-quantum well structure. When the active layer 12 includes a material of the multi-quantum well structure, the active layer 12 may be a structure in which a quantum layer and a well layer are stacked alternately with each other.

When an electric field of a suitable voltage (e.g., a set voltage or a predetermined voltage) or more is applied between end portions of the light emitting element LD, the light emitting element LD emits light while an electron-hole pair is coupled in the active layer 12. By controlling the light emission of the light emitting element LD by using such a principle, the light emitting element LD may be used as a light source of various light emitting devices including a pixel of the display device.

The active layer 12 may emit light having a wavelength of 400 nm to 900 nm. For example, when the active layer 12 emits light of a blue or green wavelength band, the active layer 12 may include an inorganic material including nitrogen, such as, AlGaN or AlGaInN. For example, when the active layer 12 is the structure in which the quantum layer and the well layer are alternately stacked in the multi-quantum well structure, the quantum layer may include an inorganic material such as AlGaN or AlGaInN, and the well layer may include an inorganic material such as GaN or AlInN. In one or more example embodiments, the active layer 12 may include AlGaInN as the quantum layer and AlInN as the well layer.

However, the disclosure is not limited thereto, and the active layer 12 may be a structure in which a semiconductor material of a kind of which band gap energy is large and semiconductor materials of which band gap energy is small are alternately stacked with each other, or may include group III to group V semiconductor materials different according to a wavelength band of emitted light. The light emitted by the active layer 12 is not limited to the light of the blue or green wavelength band, and may be light of a red wavelength band according to the included material.

For example, the light emitted from the active layer 12 may be emitted to both sides as well as an outer surface of the length direction of the light emitting element LD. Directivity of the light emitted from the active layer 12 is not limited as one direction.

The second semiconductor layer 13 may be disposed on the active layer 12 and may include a semiconductor material of a type different from that of the first semiconductor layer 11. For example, the second semiconductor layer 13 may include at least one p-type semiconductor material. For example, the second semiconductor layer 13 may include at least one semiconductor material from among InAlGaN, GaN, AlGaN, InGaN, AlN, and InN, and may include a p-type semiconductor material doped with a second conductive dopant such as Mg, Zn, Ca, Se, or Ba. However, the material configuring the second semiconductor layer 13 is not limited thereto, and various materials other than the materials described above may configure the second semiconductor layer 13.

For example, in the drawing, the first semiconductor layer 11 and the second semiconductor layer 13 are configured as one layer, but are not limited thereto. For example, the first semiconductor layer 11 and the second semiconductor layer 13 may include a greater number of layers according to the material of the active layer 12. For example, the first semiconductor layer 11 and the second semiconductor layer 13 may further include a clad layer or a tensile strain barrier reducing (TSBR) layer.

According to one or more example embodiments, a first length L1 of the first semiconductor layer 11 may be longer than a second length L2 of the second semiconductor layer 13.

According to one or more example embodiments, the light emitting element LD may further include an insulating film INF provided on a surface. The insulating film INF may be formed on the surface of the light emitting element LD to surround an outer surface (e.g., an outer peripheral surface or an outer circumferential surface) of the active layer 12, and may further surround the first semiconductor layer 11 and the second semiconductor layer 13.

According to one or more example embodiments, the insulating film INF may expose both end portions of the light emitting elements LD having different polarities. For example, the insulating film INF may not cover and may expose one end portion of the first semiconductor layer 11 and one end portion of the second semiconductor layer 13 positioned at respective end portions of the light emitting element LD in the longitudinal direction, for example, two planes (e.g., an upper surface and a lower surface) of a cylinder.

According to one or more example embodiments, the insulating film INF may include a transparent insulating material. For example, the insulating film INF may include at least one insulating material from among $SiO_2$, $Si_3N_4$, $Al_2O_3$, and $TiO_2$, but is not limited thereto. A configuration material of the insulating film INF is not particularly limited, and may be configured of currently known various insulating materials.

The insulating film INF may prevent or substantially prevent an electrical short circuit that may occur when the active layer 12 contacts a conductive material other than the first semiconductor layer 11 and the second semiconductor layer 13. In one or more example embodiments, by forming the insulating film INF, a surface defect of the light emitting element LD may be reduced or minimized to improve life and efficiency. In one or more example embodiments, when a plurality of light emitting elements LD are closely disposed, the insulating film INF may prevent or substantially prevent an unwanted short circuit that may occur between light emitting elements LD.

In one or more example embodiments, the light emitting element LD may further include an additional component disposed above and/or under each layer in addition to the first semiconductor layer 11, the active layer 12, the second semiconductor layer 13, and/or the insulating film INF. For example, the light emitting element LD may further include one or more phosphor layers, active layers, semiconductor material layers, and/or electrode layers disposed on one side of the first semiconductor layer 11, the active layer 12, and/or the second semiconductor layer 13.

Figure 3:
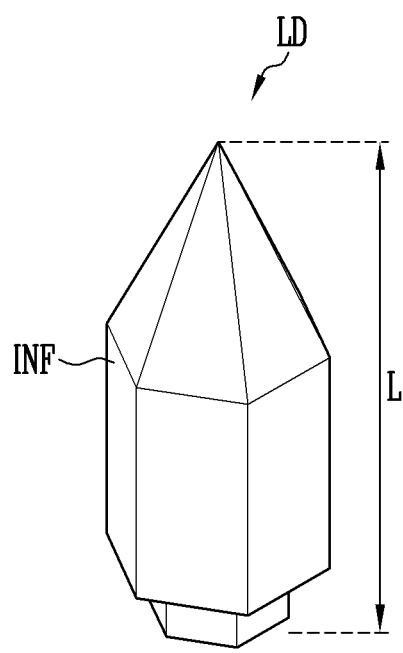
FIGS. 3 and 4 are a perspective view and a cross-sectional view illustrating a light emitting element according to another example embodiment.
Figure 4:
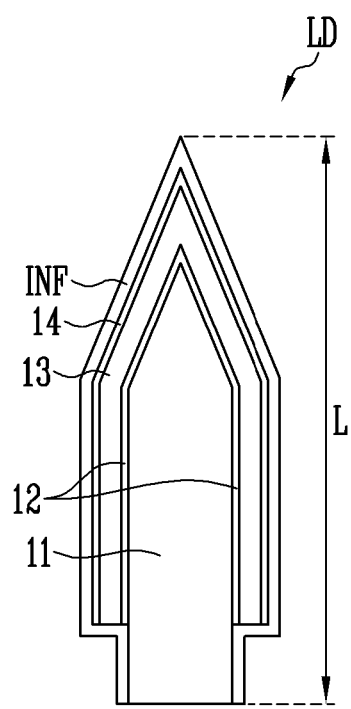

FIGS. 3 and 4 are a perspective view and a cross-sectional view illustrating a light emitting element according to another example embodiment.

Referring to FIGS. 3 and 4, the light emitting element LD according to one or more example embodiments may include a first semiconductor layer 11, a second semiconductor layer 13, and an active layer 12 interposed between the first semiconductor layer 11 and the second semiconductor layer 13. According to one or more example embodiments, the first semiconductor layer 11 may be disposed in a center region of the light emitting element LD, and the active layer 12 may be disposed on a surface of the first semiconductor layer 11 to surround at least one region of the first semiconductor layer 11. For example, the active layer 12 may be disposed along the periphery of the first semiconductor layer 11 to surround at least one region of the first semiconductor layer 11. For example, the second semiconductor layer 13 may be disposed on a surface of the active layer 12 to surround at least one region of the active layer 12. For example, the second semiconductor layer 13 may be disposed along the periphery of the active layer 12 to surround at least one region of the active layer 12.

In one or more example embodiments, the light emitting element LD may further include an electrode layer 14 and/or an insulating film INF surrounding at least one region of the second semiconductor layer 13. For example, the light emitting element LD may include the electrode layer 14 disposed on a surface of the second semiconductor layer 13 to surround one region of the second semiconductor layer 13, and the insulating film INF disposed on a surface of the electrode layer 14 to surround at least one region of the electrode layer 14. For example, the electrode layer 14 may be disposed along the periphery of the second semiconductor layer 13 to surround one region of the second semiconductor layer 13, and the insulating film INF may be disposed along the periphery of the electrode layer 14 to surround at least one region of the electrode layer 14. For example, the light emitting element LD according to the above-described embodiment may be implemented as a core-shell structure including the first semiconductor layer 11, the active layer 12, the second semiconductor layer 13, the electrode layer 14, and the insulating film INF sequentially disposed in an outer direction from a center region of the light emitting element LD. According to one or more example embodiments, the electrode layer 14 and/or the insulating film INF may be omitted.

In one or more example embodiments, the light emitting element LD may be provided in a polygonal horn like shape extending along one direction (for example, a direction of the length L). For example, the light emitting element LD may have a hexagonal horn like shape. However, the shape of the light emitting element LD is not limited thereto, and may be variously changed.

In one or more example embodiments, both end portions of the first semiconductor layer 11 may have a protruding shape along the direction of the length L of the light emitting element LD. Shapes of the both end portions of the first semiconductor layer 11 may be different from each other. For example, one end portion disposed on an upper side of the first semiconductor layer 11 may have a horn shape having one vertex where a width of the horn narrows toward an upper portion. In one or more example embodiments, the other end portion of the first semiconductor layer 11 disposed on a lower side of the first semiconductor layer 11 may have a polygonal column shape having a constant width.

According to one or more example embodiments, the first semiconductor layer 11 may be positioned at a core, for example, the center (or the center region) of the light emitting element LD. In one or more example embodiments, the light emitting element LD may be provided in a shape corresponding to the shape of the first semiconductor layer 11. For example, when the first semiconductor layer 11 has a hexagonal horn like shape, the light emitting element LD may have a hexagonal horn like shape.

Figure 5:
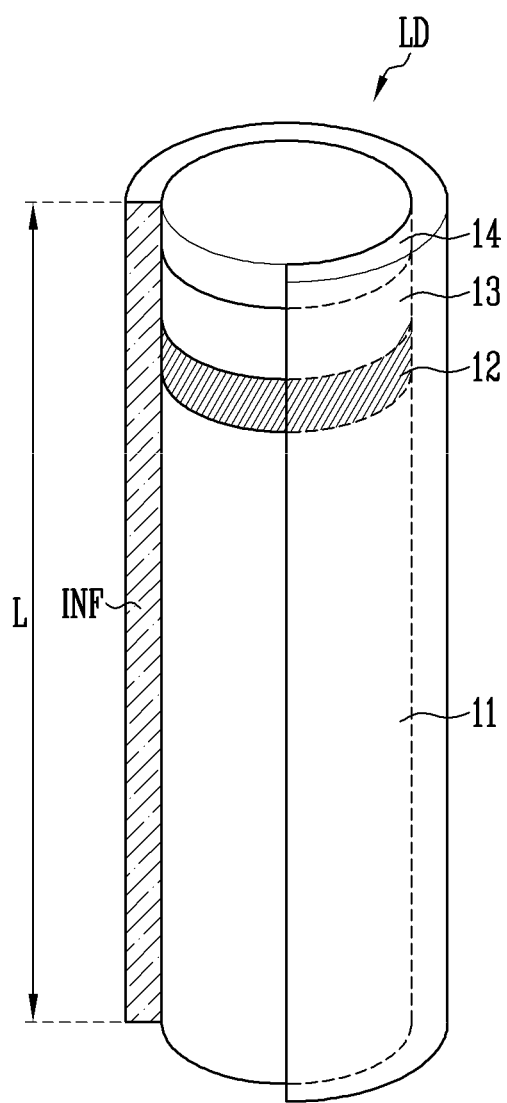
FIG. 5 is a perspective view illustrating a light emitting element according to still another example embodiment.

FIG. 5 is a perspective view illustrating a light emitting element according to still another example embodiment. In FIG. 5, a portion of the insulating film INF is omitted for convenience of description.

Referring to FIG. 5 in addition to FIGS. 1 and 2, the light emitting element LD may further include an electrode layer 14 disposed on the second semiconductor layer 13.

The electrode layer 14 may be an ohmic contact electrode electrically connected to the second semiconductor layer 13, but is not limited thereto. For example, the electrode layer 14 may be a Schottky contact electrode. The electrode layer 14 may include a metal or a metal oxide. For example, Cr, Ti, Al, Au, Ni, indium tin oxide (ITO), indium zinc oxide (IZO), indium tin-zinc oxide (ITZO), and an oxide or an alloy thereof may be used alone or in combination. According to one or more example embodiments, the electrode layer 14 may be substantially transparent or translucent. Therefore, light generated in the active layer 12 of the light emitting element LD may pass through the electrode layer 15 and may be emitted to the outside of the light emitting element LD.

Figure 6:
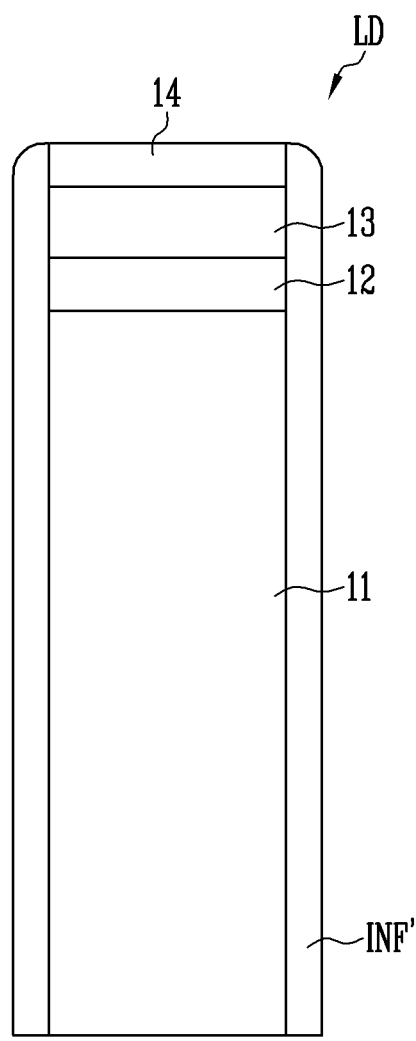
FIG. 6 is a cross-sectional view illustrating a light emitting element according to still another example embodiment of the present disclosure.

FIG. 6 is a cross-sectional view illustrating a light emitting element according to still another example embodiment of the disclosure.

Referring to FIG. 6 in addition to FIGS. 1 and 2, an insulating film INF' may have at least a portion of a curved surface shape in an edge region (e.g., a peripheral region of the light emitting element LD) adjacent to the electrode layer 14. According to one or more example embodiments, the curved surface shape may be formed by an etching process when the light emitting element LD is manufactured.

In one or more example embodiments, even though the electrode layer 14 is not included, such as, the light emitting element LD shown in FIGS. 1 and 2, the insulating film INF' may have at least a portion of a curved surface shape in an edge region.

Figure 7:
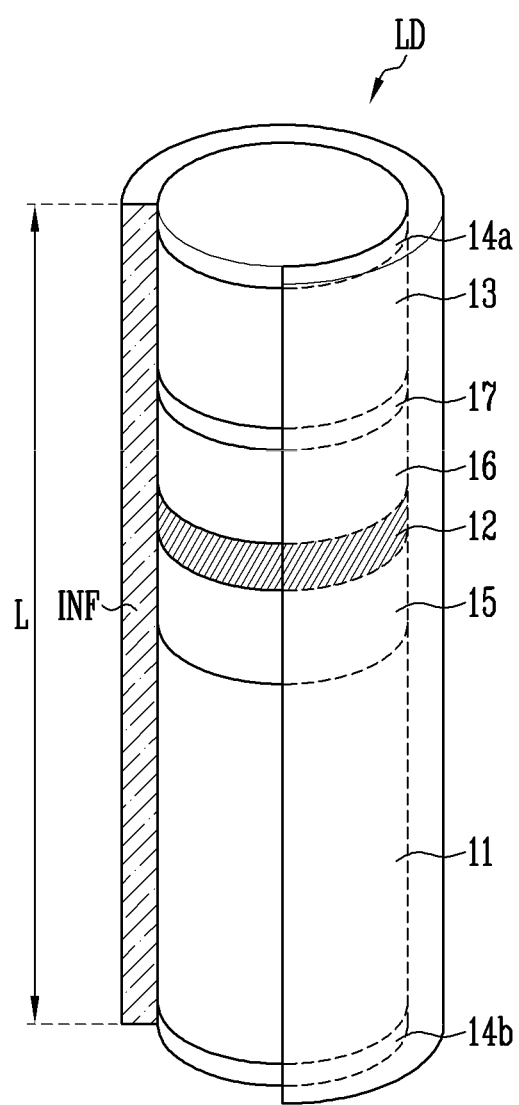
FIG. 7 is a schematic perspective view illustrating a light emitting element according to still another example embodiment.

FIG. 7 is a schematic perspective view illustrating a light emitting element according to still another example embodiment. In FIG. 7, a portion of the insulating film INF is omitted for convenience of description.

Referring to FIG. 7 in addition to FIGS. 1 and 2, the light emitting element LD may further include a third semiconductor layer 15 disposed between the first semiconductor layer 11 and the active layer 12, and a fourth semiconductor layer 16 and a fifth semiconductor layer 17 disposed between the active layer 12 and the second semiconductor layers 13. In one or more example embodiments, the light emitting element LD may further include a first electrode layer 14a formed on an upper surface of the second semiconductor layer 13 and a second electrode layer 14b formed on a lower surface of the first semiconductor layer 11.

The light emitting element LD of FIG. 7 is different from the example embodiment of FIG. 1 in that the plurality of semiconductor layers 15, 16, and 17 and the electrode layers 14a and 14b are further disposed, and the active layer 12 includes another element. In one or more example embodiments, a disposition and a structure of the insulating film INF are substantially the same as those of FIG. 1.

As described above, in the light emitting element LD of FIG. 1, the active layer 12 including an inorganic material including nitrogen (N) may emit the blue or green light. The light emitting element LD of FIG. 7 may be a semiconductor in which each of the active layer 12 and the other semiconductor layers 11, 13, 15, 16 and 17 includes at least phosphorus (P). For example, the light emitting element LD according to the embodiment of FIG. 7 may emit red light having a center wavelength range of 620 nm to 750 nm. However, it should be understood that a center wavelength band of the red light is not limited to the above-described range and includes all wavelength ranges that may be recognized as red in the present technical field.

For example, in the light emitting element LD according to the embodiment of FIG. 7, the first semiconductor layer 11 is an n-type semiconductor layer, and when the light emitting element LD emits red light, the first semiconductor layer 11 may include a semiconductor material having a chemical formula of $In_xAl_yGa_{1-x-y}P$ ($0 \le x \le 1$, $0 \le y \le 1$, $0 \le x+y \le 1$). For example, the first semiconductor layer 11 may be any one or more of n-type doped InAlGaP, GaP, AlGaP, InGaP, AlP, and InP. The first semiconductor layer 11 may be doped with an n-type dopant. For example, the n-type dopant may be Si, Ge, Sn, or the like. In one or more example embodiments, the first semiconductor layer 11 may include n-AlGaInP doped with n-type Si.

The second semiconductor layer 13 is a p-type semiconductor layer, and when the light emitting element LD emits red light, the second semiconductor layer 13 may include a semiconductor material having a chemical formula of $In_xAl_yGa_{1-x-y}P$ ($0 \le x \le 1$, $0 \le y \le 1$, $0 x+y \le 1$). For example, the second semiconductor layer 13 may be any one or more of p-type doped InAlGaP, GaP, AlGaNP, InGaP, AlP, and InP. The second semiconductor layer 13 may be doped with a p-type dopant. For example, the p-type dopant may be Mg, Zn, Ca, Se, Ba, or the like. In one or more example embodiments, the second semiconductor layer 13 may include p-GaP doped with p-type Mg.

The active layer 12 may be disposed between the first semiconductor layer 11 and the second semiconductor layer 13. Identically to the active layer 12 of FIG. 1, the active layer 12 of FIG. 7 may also emit light of a specific wavelength band by including a single or multiple quantum well structure material. For example, when the active layer 12 emits light of a red wavelength band, the active layer 12 may include a material such as AlGaP and AlInGaP. In one or more example embodiments, when the active layer 12 has a structure in which a quantum layer and a well layer are alternately stacked in a multiple quantum well structure, the quantum layer may include a material such as AlGaP or AlInGaP, and the well layer may include a material such as GaP or AlInP. In one or more example embodiments, the active layer 12 may emit red light having a center wavelength band of 620 nm to 750 nm, by including AlGaInP as the quantum layer and AlInP as the well layer.

The light emitting element LD of FIG. 7 may include a clad layer disposed adjacent to the active layer 12. As shown in the drawing (e.g., FIG. 7), the third semiconductor layer 15 and the fourth semiconductor layer 16 disposed between the first semiconductor layer 11 and the second semiconductor layer 13 in an upper portion and a lower portion of the active layer 12 may be clad layers.

The third semiconductor layer 15 may be disposed between the first semiconductor layer 11 and the active layer 12. The third semiconductor layer 15 may be an n-type semiconductor layer similar to the first semiconductor layer 11. For example, the third semiconductor layer 15 may include a semiconductor material having a chemical formula of $In_xAl_yGa_{1-x-y}P$ ($0 \leq x \leq 1$, $0 \leq y \leq 1$, $0 \leq x+y \leq 1$). In one or more example embodiments, the first semiconductor layer 11 may include n-AlGaInP, and the third semiconductor layer 15 may include n-AlInP. However, the disclosure is not limited thereto.

The fourth semiconductor layer 16 may be disposed between the active layer 12 and the second semiconductor layer 13. The fourth semiconductor layer 16 may be an n-type semiconductor similar to the second semiconductor layer 13. For example, the fourth semiconductor layer 16 may include a semiconductor material having a chemical formula of $In_xAl_yGa_{1-x-y}P$ ($0 \leq x \leq 1$, $0 \leq y \leq 1$, $0 \leq x+y \leq 1$). In one or more example embodiments, the second semiconductor layer 13 may be p-GaP, and the fourth semiconductor layer 16 may be p-AlInP.

The fifth semiconductor layer 17 may be disposed between the fourth semiconductor layer 16 and the second semiconductor layer 13. The fifth semiconductor layer 17 may be a p-type (i.e. p-doped) semiconductor layer similar to the second semiconductor layer 13 and the fourth semiconductor layer 16. In some embodiments, the fifth semiconductor layer 17 may have a function of reducing a lattice constant difference between the fourth semiconductor layer 16 and the second semiconductor layer 13. For example, the fifth semiconductor layer 17 may be a tensile strain barrier reducing (TSBR) layer. For example, the fifth semiconductor layer 17 may include p-GaInP, p-AlInP, p-AlGaInP, and the like, but is not limited thereto.

The first electrode layer 14a and the second electrode layer 14b may be disposed on the second semiconductor layer 13 and the first semiconductor layer 11, respectively. The first electrode layer 14a may be disposed on the upper surface of the second semiconductor layer 13, and the second electrode layer 14b may be disposed on the lower surface of the first semiconductor layer 11. According to one or more example embodiments, at least one of the first electrode layer 14a and the second electrode layer 14b may be omitted. Each of the first electrode layer 14a and the second electrode layer 14b may include at least one of the materials discussed with respect to the electrode layer 14 of FIG. 5.

The following embodiments are described as one or more examples to which the light emitting element LD shown in FIGS. 1 and 2 is applied. However, a person skilled in the art may apply various shapes of light emitting elements including the light emitting element LD shown in FIGS. 3-7 to various different embodiments.

Figure 8:
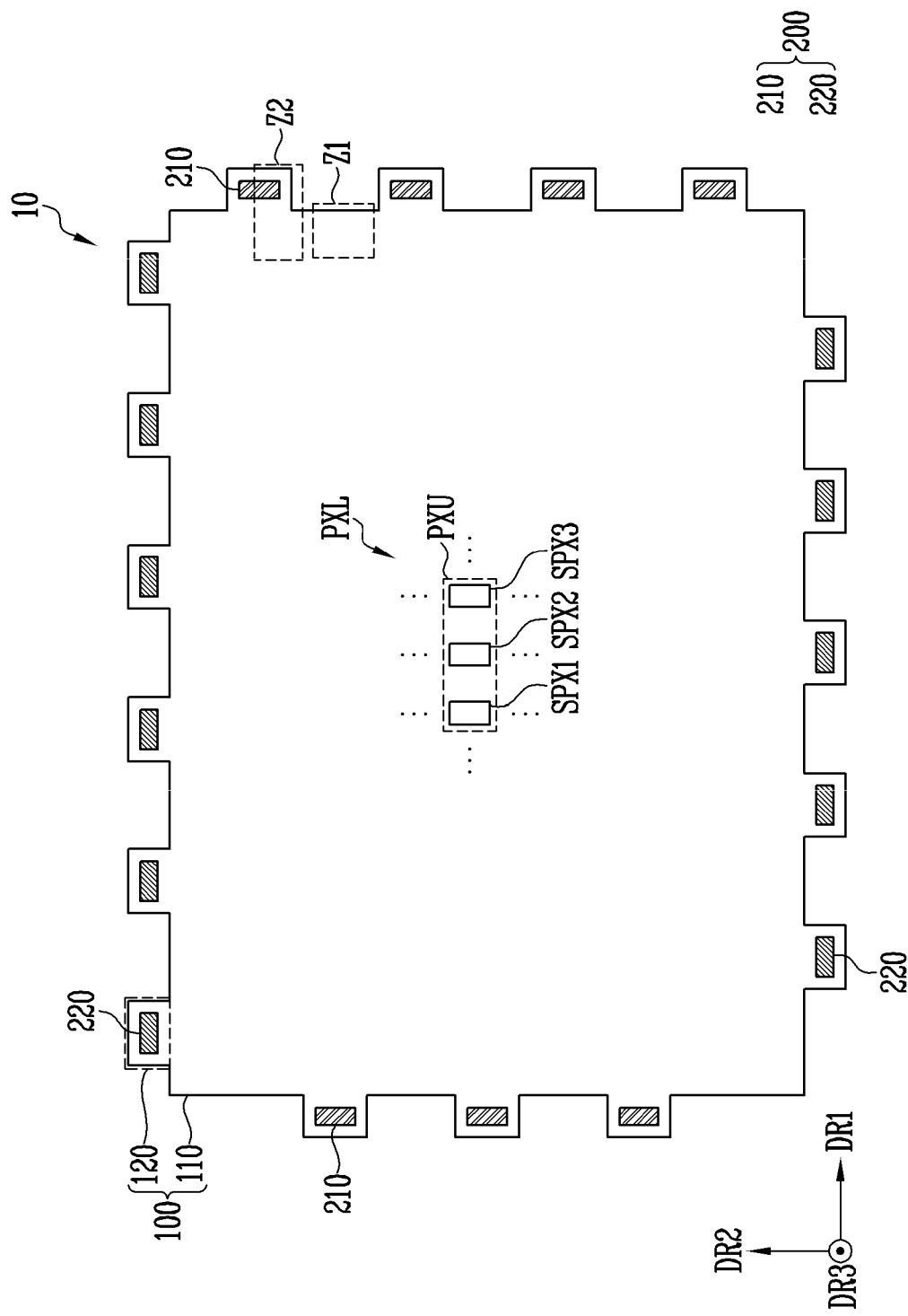
FIG. 8 is a plan view schematically illustrating a display device according to one or more example embodiments of the present disclosure.

FIG. 8 is a plan view schematically illustrating the display device according to one or more example embodiments of the disclosure.

Referring to FIGS. 1, 2, and 8, the display device 10 (or a display panel) may include the substrate 100 and the pixels PXL disposed on the substrate 100. In one or more example embodiments, the display device 10 may include drivers 200 disposed on the substrate 100. The display device 10 may display an image by driving the pixels PXL in correspondence with image data input from the outside.

The substrate 100 (or the display device 10) may include a display unit 110 on which a plurality of pixels PXL are disposed and an image is displayed and a plurality of protrusions 120 on which the drivers 200 are disposed.

The display unit 110 may have an area at which the plurality of pixels PXL are located. In one or more example embodiments, the display unit 110 may include scan lines and data lines to provide a scan signal and a data signal to the pixels PXL, and various types of lines connecting the scan lines and the data lines to the drivers 200.

The display 110 may have various shapes. For example, the display unit 110 may have various shapes, such as, a closed polygon including a side formed of a straight line, a circle, an ellipse, and the like including a side of a curve, a semicircle, a semi-ellipse, and the like including a side formed of a straight line and a curve. Hereinafter, the display unit 110 is provided in a rectangular shape including two pairs of side surfaces opposite to each other on a plane.

The protrusion 120 may be an area that is at least partially protruding from an edge of the display unit 110. The protrusions 120 may be disposed at a regular distance from a side surface of the display unit 110. The area of each of the protrusions 120 may be smaller than the area of the display unit 110. In one or more example embodiments, the display unit 110 and the protrusion 120 may be integrally formed, but are not limited thereto. In another example embodiment, the display unit 110 and the protrusion 120 may be separately formed and attached to each other.

FIG. 8 shows that three to six protrusions 120 are disposed on each side surface of the display unit 110, but this is an example, and more than six protrusions 120 may be formed on one side surface, or less than three protrusions 120 may be formed one side surface.

The number of protrusions 120 disposed on the opposite side surfaces may be different from each other. In one or more example embodiments, as shown in FIG. 8, six protrusions 120 may be disposed on one side surface from among the two side surfaces of the display unit 110 parallel to the first direction DR1, and five protrusions 120 may be disposed on another side surface from among the two side surfaces of the display unit 110 parallel to the first direction DR1. Here, the protrusions 120 protruding from the side surfaces parallel to the first direction DR1 may not overlap with each other along the second direction DR2.

In one or more example embodiments, four protrusions 120 may be disposed on one side surface from among the two side surfaces parallel to the second direction DR2, and three protrusions 120 may be disposed on another side surface from among the two side surfaces parallel to the second direction DR2. Here, the protrusions 120 protruding from the side surfaces parallel to the second direction DR2 may not overlap each other along the first direction DR1.

However, a disposition position, the number, and the like, of the protrusions 120 disposed on each side surface of the display unit 110 are not limited to the above. For example, the same number of protrusions 120 may be disposed on the opposite side surfaces, and the protrusions 120 disposed on each of the side surfaces may overlap with each other along the first direction DR1 or the second direction DR2.

The substrate 100 may be a rigid substrate or a flexible substrate, and a material or a physical property thereof is not particularly limited. For example, the substrate 100 may be a rigid substrate formed of glass or tempered glass, or a flexible substrate formed of a thin film of a plastic or metal material. In one or more example embodiments, the substrate 100 may be a transparent substrate, but is not limited thereto. For example, the substrate 100 may be a translucent substrate, an opaque substrate, or a reflective substrate.

For example, the substrate 100 may be formed of polyimide (PI), polyethersulfone (PES), polyacrylate (PAC), polyarylate (PAR), polyetherimide (PEI), polyethylene naphthalate (PEN), polyethylene terephthalate (PET), polyphenylene sulfide (PPS), polycarbonate (PC), cellulose triacetate (CTA), cellulose acetate propionate (CAP), or a combination thereof.

Each of the pixels PXL may include at least one light emitting element connected to the scan lines and the data lines and driven by corresponding scan signal and data signal. For example, each of the pixels PXL may include an inorganic light emitting element in which a light emission layer is formed of an inorganic material, but is not limited thereto. In another example, the pixels PXL may include an organic light emitting element (e.g., an organic light emitting diode (OLED)) in which the light emission layer is formed of an organic material. Hereinafter, the pixels PXL will be described as including one of the light emitting elements LD described with reference to FIGS. 1-7.

The display unit 110 may include the plurality of pixels PXL arranged along the first direction DR1 and the second direction DR2 in a matrix form. However, an arrangement form of the pixels PXL is not particularly limited, and the pixels PXL may be arranged in various suitable forms.

Each of the pixels PXL may emit one of red, green, and blue light, but is not limited thereto. For example, each of the pixels PXL may emit one of cyan, magenta, yellow, and white light.

In one or more example embodiments, the pixels PXL may include a first sub pixel SPX1 that emits light of a first color, a second sub pixel SPX2 that emits light of a second color different from the first color, and a third sub pixel SPX3 that emits light of a third color different from the first color and the second color. At least one first sub pixel SPX1, second sub pixel SPX2, and third sub pixel SPX3 may be adjacent to each other and may configure one pixel unit PXU capable of emitting light of various colors.

In one or more example embodiments, the first sub pixel SPX1 may be a red pixel emitting red light, the second sub pixel SPX2 may be a green pixel emitting green light, and the third sub pixel SPX3 may be a blue pixel emitting blue light.

According to one or more example embodiments, the pixels PXL may include the light emitting elements LD that emit light of the same color, and the pixels PXL may emit light of different colors by including color conversion layers (or wavelength conversion layers) of different colors disposed on the respective light emitting elements LD. Here, the light emitting element LD included in the pixels PXL may be a blue light emitting element, but is not limited thereto. In another example embodiment, the pixels PXL may include light emitting elements that emit light of different colors. For example, the first sub pixel SPX1 may include a red light emitting element, the second sub pixel SPX2 may include a green light emitting element, and the third sub pixel SPX3 may include a blue light emitting element.

The drivers 200 may include a first driver 210 (or the scan driver) providing the scan signal to the pixels PXL through the scan line and a second driver 220 (or the data driver) providing the data signal to the pixels PXL through the data line. According to one or more example embodiments, the drivers 200 may further include a light emission control driver that provides a light emission control signal to the pixels PXL through a light emission control line.

Although not shown in the drawing, the drivers 200 may further include a timing controller connected to the first driver 210, the second driver 220, and the emission control driver. The timing controller may control operations of the first driver 210, the second driver 220, and the emission control driver.

The first driver 210 may be disposed on the protrusion 120 of the substrate 100. For example, as shown in FIG. 8, the first driver 210 may be disposed on the protrusions 120 protruding from the side surface positioned in the first direction DR1 and the side surface positioned in a direction opposite to the first direction DR1 of the display unit 110. For example, as shown in FIG. 8, the first driver 210 may be disposed on the protrusions 120 protruding from the side surfaces of the display unit 110 positioned to be spaced from each other in the first direction DR1. For example, the first driver 210 may be disposed on the protrusions 120 protruding from the side surfaces parallel to the second direction DR2 from among the side surfaces of the display unit 110.

The first driver 210 may include integrated circuit chips (IC chips) and may be disposed on each of the protrusions 120, but is not limited thereto. For example, the first driver 210 may be directly formed on the protrusions 120. For example, circuit elements configuring the first driver 210 may be directly formed on the protrusions 120. In another example embodiment, the first driver 210 may be disposed on a separate connection member (or a connection film), and the connection member may be attached to the protrusion 120.

The first driver 210 may be electrically connected to the pixels PXL to provide a first signal to the pixels PXL. In one or more example embodiments, the first driver 210 may be the scan driver, and may provide the scan signal to the pixels PXL. In one or more example embodiments, one pixel PXL may be electrically connected to two or more first drivers 210. For example, the pixel PXL may be electrically connected to the first driver 210 disposed on one side surface from among the opposite side surfaces and the first driver 210 disposed on the other side surface to receive the same scan signal. In another example embodiment, the pixel PXL may be electrically connected to one of the first drivers 210 disposed on the opposite side surfaces to receive the scan signal.

The second driver 220 may be disposed on the protrusion 120 of the substrate 100. In one or more example embodiments, as shown in FIG. 8, the second driver 220 may be disposed on the protrusions 120 protruding from the side surface positioned in the second direction DR2 and the side surface positioned in a direction opposite to the second direction DR2 of the display unit 110. For example, as shown in FIG. 8, the second driver 220 may be disposed on the protrusions 120 protruding from the side surface positioned to be spaced from each other in the second direction DR2. For example, the second driver 220 may be disposed on the protrusions 120 protruding from the side surfaces parallel to the first direction DR1 from among the side surfaces of the display unit 110.

The second driver 220 may include integrated circuit chips (IC chips) and may be disposed on each of the protrusions 120, but is not limited thereto. For example, the second driver 220 may be disposed on a separate connection member (or a connection film), and the connection member may be attached to the protrusion 120.

The second driver 220 may be electrically connected to the pixels PXL to provide a second signal to the pixels PXL. In one or more example embodiments, the second driver 220 may be the data driver, and may provide the data signal to the pixels PXL. In one or more example embodiments, one pixel PXL may be electrically connected to two or more data drivers 220. For example, the pixel PXL may be electrically connected to the second driver 220 disposed on one side surface from among the opposite side surfaces and the second driver 220 disposed on the other side surface to receive the same data signal. In another example embodiment, the pixel PXL may be electrically connected to one of the second driver 220 disposed on the opposite side surfaces to receive the data signal.

As described above, the pixel PXL may be electrically connected to the first driver 210 and the second driver 220, and may emit light in correspondence with the first signal (or the scan signal) from the first driver 210 and the second signal (or the data signal) from the second driver 220.

Figure 9A:
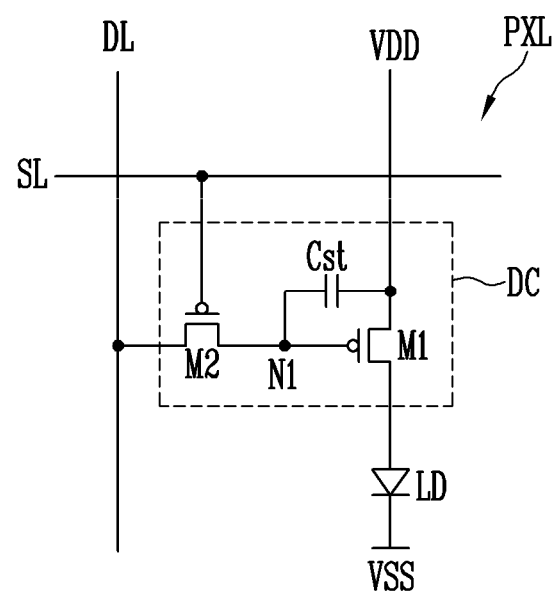
FIGS. 9A-9C are circuit diagrams illustrating a pixel according to one or more example embodiments, respectively.
Figure 9B:
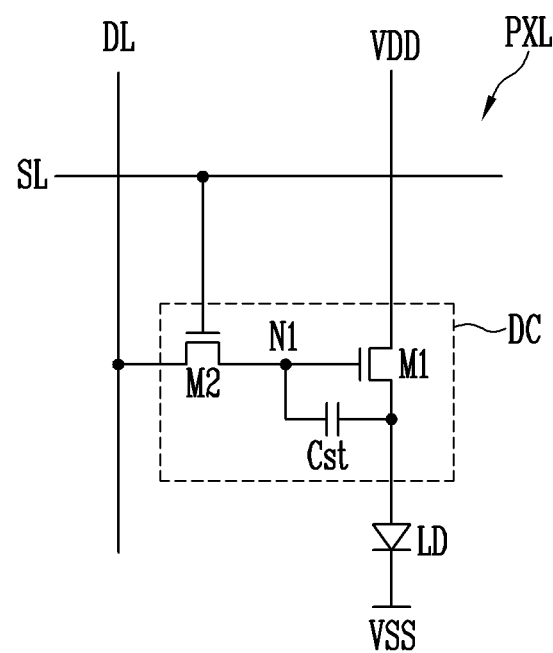
Figure 9C:
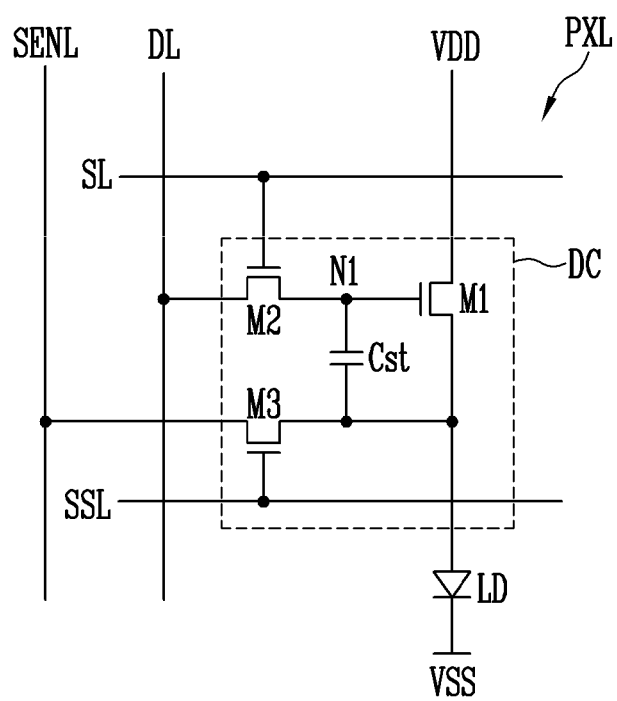

FIGS. 9A-9C are circuit diagrams illustrating a pixel according to one or more example embodiments of the present disclosure. For example, FIGS. 9A-9C show an example of the pixel including an active light emitting display panel.

Referring to FIGS. 1-9A, the pixel PXL may include at least one light emitting element LD and a driving circuit DC connected to the light emitting element LD to drive the light emitting element LD.

A first electrode (for example, an anode) of the light emitting element LD may be connected to a first driving power source VDD through the driving circuit DC, and a second electrode (for example, a cathode) of the light emitting element LD may be connected to a second driving power source VSS. The light emitting element LD may emit light at a luminance corresponding to a driving current amount controlled by the driving circuit DC.

Although only one light emitting element LD is shown in FIG. 9A, FIG. 9A merely illustrates an example configuration, and according to one or more example embodiments, the pixel PXL may include a plurality of light emitting elements LD. The plurality of light emitting elements LD may be connected in parallel and/or series with each other.

The first driving power source VDD and the second driving power source VSS may have different potentials. For example, the first driving power source VDD may have a potential equal to or greater than a potential of the second driving power source VSS by a threshold voltage or more of the light emitting element LD. For example, a voltage applied through the first driving power source VDD may be greater than a voltage applied through the second driving power source VSS.

According to one or more example embodiments of the disclosure, the driving circuit DC may include a first transistor M1, a second transistor M2, and a storage capacitor Cst.

A first electrode of the first transistor M1 (e.g., a driving transistor) may be connected to the first driving power source VDD, and a second electrode of the first transistor M1 may be electrically connected to the first electrode (for example, the anode) of the light emitting element LD. A gate electrode of the first transistor M1 may be connected to a first node N1. The first transistor M1 may control a driving current amount supplied to the light emitting elements LD in correspondence with (or according to) a voltage of the first node N1.

A first electrode of the second transistor M2 (e.g., a switching transistor) may be connected to the data line DL, and a second electrode of the second transistor M2 may be connected to the first node N1. Here, the first electrode and the second electrode of the second transistor M2 may be different electrodes, and for example, when the first electrode is a source electrode, the second electrode may be a drain electrode. A gate electrode of the second transistor M2 may be connected to the scan line SL.

The second transistor M2 may be turned on when a scan signal of a voltage (for example, a gate on voltage, e.g., a low level voltage)) at which the first transistor M1 may be turned on is supplied from the scan line SL, to electrically connect the data line DL and the first node N1 to each other. At this time, a data signal of a corresponding frame may be supplied to the data line DL, and thus the data signal may be transferred to the first node N1. The data signal transferred to the first node N1 may be stored in the storage capacitor Cst.

One electrode of the storage capacitor Cst may be connected to the first driving power source VDD, and another electrode of the storage capacitor Cst may be connected to the first node N1. The storage capacitor Cst may be charged with a voltage corresponding to the data signal supplied to the first node N1, and may maintain the charged voltage until the data signal of a next frame is supplied.

For convenience of description, FIG. 9A shows the driving circuit DC of a relatively simple structure, which includes the second transistor M2 for transferring the data signal into each pixel PXL, the storage capacitor Cst for storing the data signal, and the first transistor M1 for supplying the driving current corresponding to the data signal to the light emitting element LD.

However, the disclosure is not limited thereto, and the structure of the driving circuit DC may be variously changed and implemented. For example, the driving circuit DC may further include other circuit elements such as various transistors, such as, a compensation transistor to compensate for a threshold voltage of the first transistor M1, an initialization transistor for initializing the first node N1, and/or a light emission control transistor for controlling a light emission time of the light emitting element LD.

For example, in FIG. 9A, all of the transistors included in the driving circuit DC, for example, the first and second transistors M1 and M2 are P-type transistors, but the disclosure is not limited thereto. For example, at least one of the first and second transistors M1 and M2 included in the driving circuit DC may be changed to an N-type transistor.

For example, as shown in FIG. 9B, the first and second transistors M1 and M2 of the driving circuit DC may be implemented as N-type transistors. A driving circuit DC shown in FIG. 9B may have a configuration or an operation similar to that of the driving circuit DC of FIG. 9A except for a connection position change of some components due to a transistor type change.

In another example, referring to FIG. 9C, the pixel PXL may further include a third transistor M3 (e.g., a sensing transistor).

A gate electrode of the third transistor M3 may be connected to a sensing signal line SSL. One electrode of the third transistor M3 may be connected to a sensing line SENL, and another electrode of the third transistor M3 may be connected to the anode of the light emitting element LD. In the example embodiment of FIG. 9C, the storage capacitor is connected between the first node N1 and the electrode of the third transistor M3 that is connected to the anode of the light emitting element LD. The third transistor M3 may transfer a voltage value at the anode of the light emitting element LD to the sensing line SENL according to a sensing signal supplied to the sensing signal line SSL during a sensing period. The voltage value transferred through the sensing line SENL may be provided to an external circuit (for example, the timing controller), and the external circuit may extract characteristic information (for example, the threshold voltage or the like of the first transistor M1) of the pixel PXL, based on the provided voltage value. The extracted characteristic information may be used to convert image data such that a characteristic deviation of the pixel PXL may be compensated.

Figure 10:
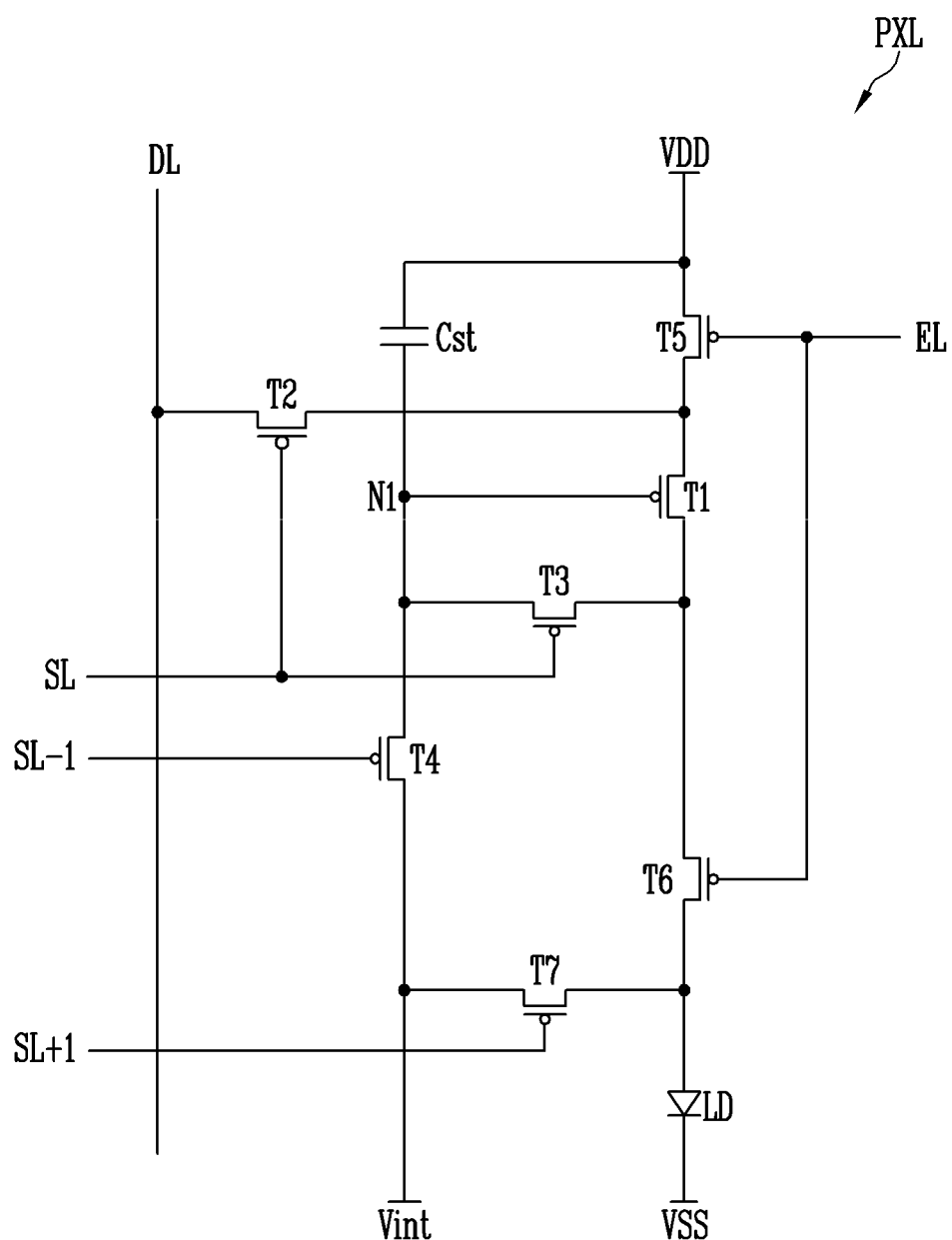
FIG. 10 is a circuit diagram illustrating a pixel according to another example embodiment.

FIG. 10 is a circuit diagram illustrating a pixel according to another example embodiment of the present disclosure.

Referring to FIG. 10, the pixel PXL according to another example embodiment of the disclosure may include a light emitting element LD, first to seventh transistors T1, T2, T3, T4, T5, T6, and T7, and a storage capacitor Cst.

A first electrode (for example, an anode) of the light emitting element LD may be connected to the first transistor T1 through the sixth transistor T6, and a second electrode (for example, a cathode) of the light emitting element LD may be connected to the second driving power source VSS. The light emitting element LD may emit light at a luminance (e.g., a set luminance or a predetermined luminance) corresponding to a driving current amount supplied from the first transistor T1.

One electrode of the first transistor T1 (e.g., a driving transistor) may be connected to the first driving power source VDD through the fifth transistor T5, and another electrode of the first transistor T1 may be connected to the first electrode of the light emitting element LD through the sixth transistor T6. The first transistor T1 may control an amount of current flowing from the first driving power source VDD to the second driving power source VSS through the light emitting element LD, in correspondence with a voltage of the first node N1 that is connected to a gate electrode of the first transistor M1.

The second transistor T2 (e.g., a switching transistor) may be connected between the data line DL and the one electrode of the first transistor T1. In one or more example embodiments, a gate electrode of the second transistor T2 may be connected to the scan line SL. The second transistor T2 may be turned on when a scan signal of a gate on voltage (e.g., a low level voltage) is supplied to the scan line SL, to electrically connect the data line DL and the one electrode of the first transistor T1 to each other.

The third transistor T3 may be connected between the other electrode of the first transistor T1 and the first node N1. In one or more example embodiments, a gate electrode of the third transistor T3 may be connected to the scan line SL. The third transistor T3 may be turned on when the scan signal of the gate on voltage (e.g., a low level voltage) is supplied to the scan line SL, to electrically connect the other electrode of the first transistor T1 and the first node N1 to each other.

The fourth transistor T4 may be connected between the first node N1 and an initialization power source Vint. In one or more example embodiments, a gate electrode of the fourth transistor T4 may be connected to a scan line SL−1 (e.g., a previous scan line). The fourth transistor T4 may be turned on when the scan signal of the gate on voltage (e.g., a low level voltage) is supplied to the scan line SL−1, to supply a voltage of the initialization power source Vint to the first node N1. Here, the initialization power source Vint may be set to a voltage lower than that of the data signal. The scan signal supplied to the scan line SL−1 may have the same waveform as the scan signal supplied to the scan line of a previous stage pixel.

The fifth transistor T5 may be connected between the first driving power source VDD and the one electrode of the first transistor T1. A gate electrode of the fifth transistor T5 may be connected to an emission control line EL. The fifth transistor T5 may be turned on when an emission control signal of a gate on voltage (e.g., a low level voltage) is supplied to the emission control line EL, and may be turned off in other cases.

The sixth transistor T6 may be connected between the other electrode of the first transistor T1 and the first electrode of the light emitting element LD. A gate electrode of the sixth transistor T6 may be connected to the emission control line EL. The sixth transistor T6 may be turned on when the light emission control signal of the gate on voltage (e.g., a low level voltage) is supplied to the emission control line EL, and may be turned off in other cases.

The seventh transistor T7 may be connected between the initialization power source Vint and the first electrode (for example, the anode) of the light emitting element LD. In one or more example embodiments, a gate electrode of the seventh transistor T7 may be connected to a scan line SL+1 (e.g., a subsequent scan line). The seventh transistor T7 may be turned on when the scan signal of the gate on voltage (e.g., a low level voltage) is supplied to the scan line SL+1, to supply the voltage of the initialization power source Vint to the first electrode of the light emitting element LD. The scan signal supplied to the scan line SL+1 may have the same waveform as the scan signal supplied to the scan line of subsequent stage pixel.

FIG. 10 shows a case where the gate electrode of the seventh transistor T7 is connected to the scan line SL+1. However, the technical spirit of the disclosure is not limited thereto. For example, in another example embodiment of the disclosure, the gate electrode of the seventh transistor T7 may be connected to the scan line SL or the scan line SL−1. In such a case, the voltage of the initialization power source Vint may be supplied to the anode of the light emitting element LD through the seventh transistor T7 when the scan signal of the gate on voltage (e.g., a low level voltage) is supplied to the scan line SL or the scan line SL−1.

The storage capacitor Cst may be connected between the first driving power source VDD and the first node N1. The storage capacitor Cst may store a voltage corresponding to the data signal and the threshold voltage of the first transistor T1.

In FIG. 10, all of the transistors included in the driving circuit DC, for example, the first to seventh transistors T1, T2, T3, T4, T5, T6, and T7 are P-type transistors, however, the disclosure is not limited thereto. For example, at least one of the first to seventh transistors T1, T2, T3, T4, T5, T6, and T7 may be changed to an N-type transistor.

Figure 11:
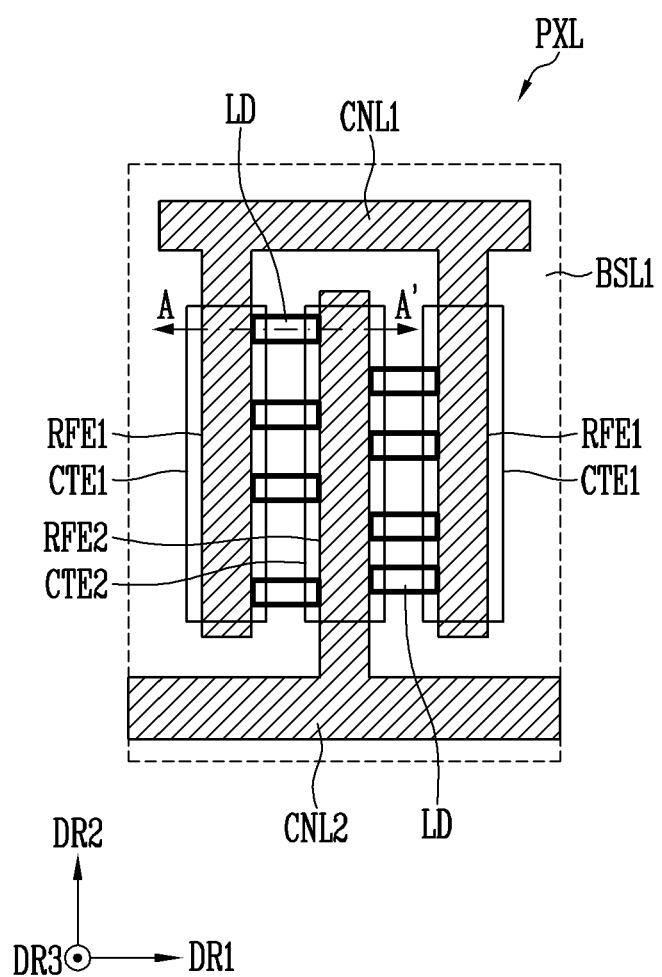
FIG. 11 is a plan view illustrating an example of the pixel included in the display device of FIG. 8.
Figure 12:
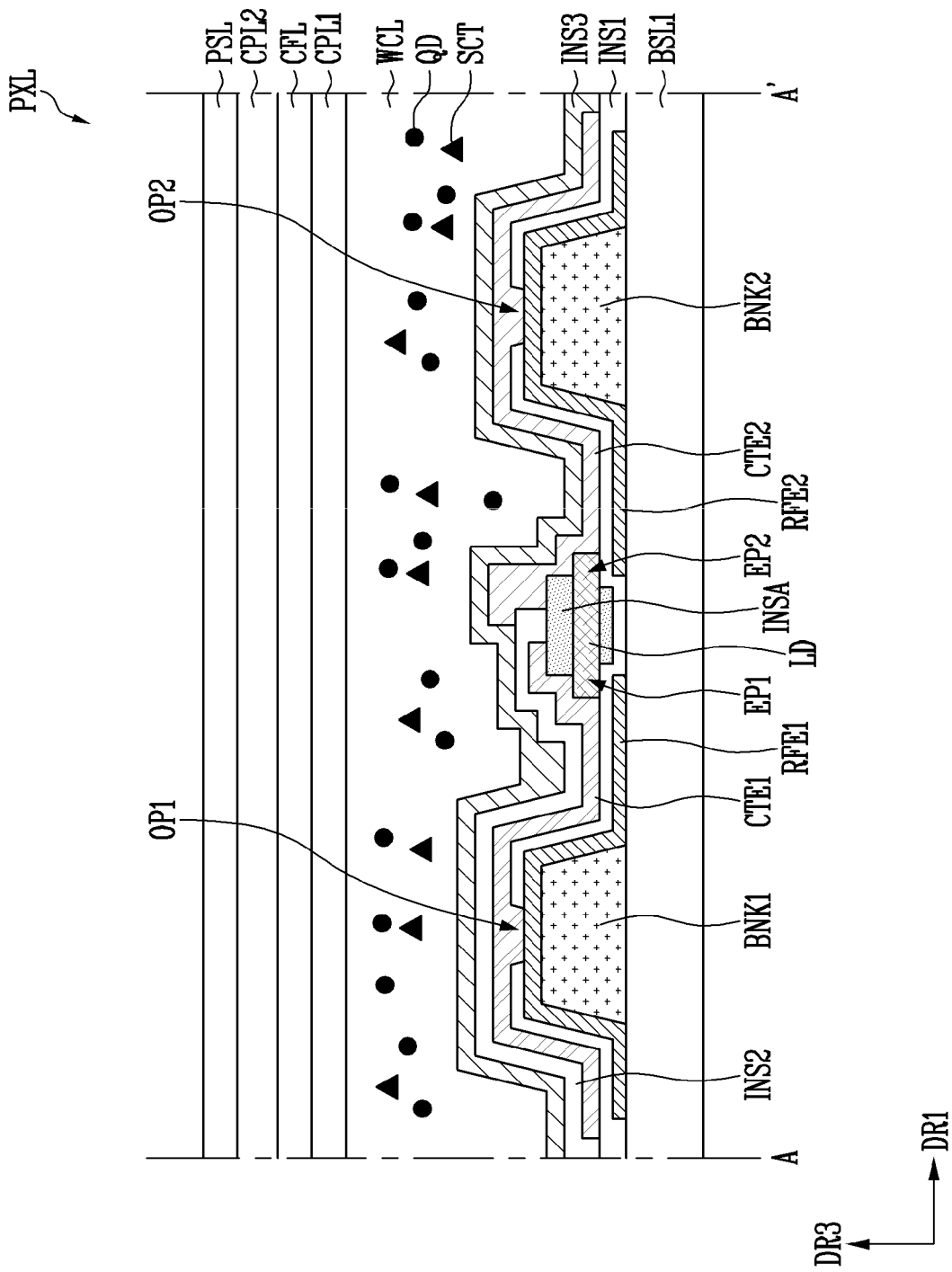
FIG. 12 is a cross-sectional view of the pixel taken along the line A-A' of FIG. 11.

FIG. 11 is a plan view illustrating an example of the pixel included in the display device of FIG. 8. FIG. 12 is a cross-sectional view of the pixel taken along a line A-A' of FIG. 11.

Referring to FIGS. 11 and 12, the pixel PXL according to one or more example embodiments of the disclosure may include a first electrode RFE1, a second electrode RFE2, a first insulating layer INS1, and the light emitting element LD. The pixel PXL may further include a first bank BNK1, a second bank BNK2, a fix layer INSA, a third electrode CTE1, a fourth electrode CTE2, a second insulating layer INS2, a third insulating layer INS3, a wavelength conversion layer WCL, a first capping layer CPL1, a color filter layer CFL, and a second capping layer CPL2.

A first base layer BSL1 on which the pixel PXL is disposed may be one of layers positioned on the substrate 100. For example, when a pixel circuit layer for driving the pixel PXL is formed on the substrate 100, the first base layer BSL1 may be an insulating layer disposed on the uppermost layer of the pixel circuit layer.

The first bank BNK1 and the second bank BNK2 may be disposed on the first base layer BLS1. A space in which the light emitting element LD is disposed may be provided between the first bank BNK1 and the second bank BNK2. In one or more example embodiments, the first bank BNK1 and the second bank BNK2 may be spaced along the first direction DR1 on the first base layer BLS1 by a distance equal to or greater than the length of the light emitting element LD. The first bank BNK1 and the second bank BNK2 may be disposed at the same layer, and may have substantially the same height, but are not limited thereto. In one or more example embodiments, the first bank BNK1 and the second bank BNK2 may extend along the second direction DR2 crossing the first direction DR1.

The first bank BNK1 and the second bank BNK2 may include an insulating material including an organic material or an inorganic material, but the material of the first bank BNK1 and the second bank BNK2 is not limited thereto. In one or more example embodiments, the first bank BNK1 and the second bank BNK2 may be formed of a single layer, but are not limited thereto, and may be formed of multiple layers. In some embodiments, the first bank BNK1 and the second bank BNK2 may be a structure in which at least one organic insulating film and at least one inorganic insulating film are stacked.

In one or more example embodiments, cross section of each of the first bank BNK1 and the second bank BNK2 may have a trapezoidal shape in which a side surface is inclined at an angle (e.g., a set angle or a predetermined angle), but a shape of one cross section of the first bank BNK1 and the second bank BNK2 is not limited thereto, and may have various shapes such as a semi-elliptical shape, a circular shape, and a quadrangular shape.

According to one or more example embodiments, the first bank BNK1 and/or the second bank BNK2 may be omitted.

The first electrode RFE1 and the second electrode RFE2 may be disposed on the first bank BNK1 and the second bank BNK2, respectively. For example, the first electrode RFE1 may be on the first bank BNK1, and the second electrode RFE2 may be on the second bank BNK2. According to one or more example embodiments, when the pixel PXL does not include the first bank BNK1 and the second bank BNK2, the first electrode RFE1 and the second electrode RFE2 may be directly on the first base layer BSL1.

The first electrode RFE1 and the second electrode RFE2 may be spaced from each other. The first electrode RFE1 and the second electrode RFE2 may be spaced from each other by a distance (e.g., a set distance or a predetermined distance) along the first direction DR1. Here, a distance at which the first electrode RFE1 and the second electrode RFE2 are spaced from each other may be less than the length of the light emitting element LD. Accordingly, when the light emitting element LD is disposed in a center portion between the first electrode RFE1 and the second electrode RFE2, at least a portion of the first electrode RFE1 and at least a portion of the second electrode RFE2 may overlap the light emitting elements LD in the third direction DR3. The first electrode RFE1 and the second electrode RFE2 may extend along the second direction DR2 on a plane.

The first electrode RFE1 may be connected to a first connection line CNL1, and the second electrode RFE2 may be connected to a second connection line CNL2. According to one or more example embodiments, the first connection line CNL1 may be provided integrally with the first electrode RFE1, and the second connection line CNL2 may be provided integrally with the second electrode RFE2.

The first electrode RFE1 and the second electrode RFE2 may have a substantially uniform thickness along a surface of the first bank BNK1 and the second bank BNK2. The first electrode RFE1 and the second electrode RFE2 may correspond to a shape of the first bank BNK1 and the second bank BNK2. For example, the first electrode RFE1 may have a shape corresponding to an inclination of the first bank BNK1, and the second electrode RFE2 may have a shape corresponding to an inclination of the second bank BNK2.

The first electrode RFE1 and the second electrode RFE2 may be formed of a conductive material. For example, each of the first electrode RFE1 and the second electrode RFE2 may include metal such as Al, Mg, Ag, Pt, Pd, Au, Ni, Nd, Ir, Cr, Ti, and an alloy thereof. In another example, each of the first electrode RFE1 and the second electrode RFE2 may include a transparent conductive material such as indium tin oxide (ITO), indium zinc oxide (IZO), zinc oxide (ZnO), and indium tin zinc oxide (ITZO).

Here, the material of the first electrode RFE1 and the second electrode RFE2 is not limited to the above-described materials. For example, the first electrode RFE1 and the second electrode RFE2 may include a conductive material having a constant reflectance. When the first electrode RFE1 and the second electrode RFE2 are formed of the conductive material having a constant reflectance, light emitted from a first end portion EP1 and a second end portion EP2 of the light emitting element LD may be reflected by the first electrode RFE1 and the second electrode RFE2 and may be progressed in a display direction (for example, the third direction DR3).

In one or more example embodiments, the first electrode RFE1 and the second electrode RFE2 may have a shape corresponding to the shape of the first bank BNK1 and the second bank BNK2, and may have a constant angle with respect to the first base layer BSL1. The light emitted from the first end portion EP1 and the second end portion EP2 of each of the light emitting elements LD may be reflected by the first electrode RFE1 and the second electrode RFE2 and may be further progressed in the third direction DR3. Therefore, light output efficiency of the display device may be improved.

One of the first electrode RFE1 and the second electrode RFE2 may be an anode, and the other one of the first electrode RFE1 and the second electrode RFE2 may be a cathode. For example, the first electrode RFE1 may be the anode, and the second electrode RFE2 may be the cathode. However, the disclosure is not limited thereto, and vice versa.

The first electrode RFE1 and the second electrode RFE2 may provide a driving signal to the light emitting element LD in correspondence with the scan signal and the data signal, and the light emitting element LD may emit light in correspondence with the provided driving signal.

The first electrode RFE1 and the second electrode RFE2 may be disposed at the same plane, and may have substantially the same thickness. In one or more example embodiments, the first electrode RFE1 and the second electrode RFE2 may be concurrently formed (e.g., substantially simultaneously) formed in the same process.

The first connection line CNL1 and the second connection line CNL2 may be electrically connected to the power line and the driving circuit through a contact hole or a separate connection member. Accordingly, the first connection line CNL1 and the second connection line CNL2 may transfer the driving signal to the first electrode RFE1 and the second electrode RFE2, respectively. The light emitting element LD may emit light in correspondence with the driving signal applied to the first electrode RFE1 and the second electrode RFE2 through the first connection line CNL1 and the second connection line CNL2.

Referring to FIGS. 9A and 12, each of the first electrode RFE1 and the second electrode RFE2 may be electrically connected to any one of the driving circuit DC and the second driving power source VSS through a separate connection line or connection member. For example, the first electrode RFE1 may be electrically connected to the driving circuit DC, and the second electrode RFE2 may be electrically connected to the second driving power source VSS.

The first electrode RFE1 and the second electrode RFE2 may provide the driving signal to the light emitting element LD, and the light emitting element LD may emit light of a luminance (e.g., a set luminance or a predetermined luminance) in correspondence with the driving current from the driving circuit DC.

The first insulating layer INS1 may be provided on the first electrode RFE1 and the second electrode RFE2. The first insulating layer INS1 may be entirely provided on the first base layer BSL1 to cover the first bank BNK1, the second bank BNK2, the first electrode RFE1, and the second electrode RFE2 described above. In one or more example embodiments, the first insulating layer INS1 may be disposed along a surface of the first base layer BSL1 where the first bank BNK1, the second bank BNK2, the first electrode RFE1 and the second electrode RFE2 are not disposed.

In one or more example embodiments, the first insulating layer INS1 may be an inorganic insulating layer formed of an inorganic material. In such a case, the first insulating layer INS1 may have a generally uniform thickness along the first base layer BSL1 and the surface of the first electrode RFE1 and the second electrode RFE2.

In one or more example embodiments, the first insulating layer INS1 may include a first opening OP1 and a second opening OP2. The first opening OP1 and the second opening OP2 may expose at least a portion of the first electrode RFE1 and the second electrode RFE2.

The first opening OP1 and the second opening OP2 may be formed to overlap the first electrode RFE1 and the second electrode RFE2, respectively. For example, the first opening OP1 may be formed to overlap the first electrode RFE1, and the second opening OP2 may be formed to overlap the second electrode RFE2.

The first opening OP1 and the second opening OP2 may have a thickness and/or a depth corresponding to a thickness of the first insulating layer INS1. For example, the first opening OP1 and the second opening OP2 may completely pass through the first insulating layer INS1 in corresponding regions of the first electrode RFE1 and the second electrode RFE2. Accordingly, a portion of the first electrode RFE1 and the second electrode RFE2 may be exposed to the outside to come in contact with the third electrode CTE1 and the fourth electrode CTE2, which will be described later.

The light emitting element LD may be disposed on the first insulating layer INS1. The light emitting element LD may be disposed in the space provided by the first bank BNK1 and the second bank BNK2. When viewed on a plan view, the light emitting element LD may be disposed between the first electrode RFE1 and the second electrode RFE2.

The fix layer INSA for stably supporting and fixing the light emitting element LD may be disposed on the light emitting element LD. The fix layer INSA may be an inorganic insulating film including an inorganic material or an organic insulating film including an organic material. The fix layer INSA may cover at least a portion of an outer surface (e.g., an outer peripheral surface or an outer circumferential surface) of each of the light emitting elements LD, and may be formed to expose the first end portion EP1 and the second end portion EP2 of the light emitting element LD. Accordingly, the fix layer INSA may prevent or substantially prevent the light emitting element LD from being separated from the substrate 100. According to one or more example embodiments, the fix layer INSA may be disposed to fill a space between the light emitting element LD and the first insulating layer INS1. The fix layer INSA may be omitted according to process condition or the like of the display device.

The third electrode CTE1 (or a first contact electrode) and the fourth electrode CTE2 (or a second contact electrode) may be provided on the first insulating layer INS1, the light emitting element LD, and the fix layer INSA. In one or more example embodiments, the second insulating layer INS2 may be provided between the third electrode CTE1 and the fourth electrode CTE2.

The third electrode CTE1 and the fourth electrode CTE2 may be in contact with one of the end portions EP1 and EP2 of each light emitting element LD. For example, the third electrode CTE1 may be in contact with the first end portion EP1 of each light emitting element LD, and the fourth electrode CTE2 may be in contact with the second end portion EP2 of each light emitting element LD.

When viewed on a plan view, the third electrode CTE1 may cover at least a portion of the first electrode RFE1. The third electrode CTE1 may be electrically connected to the first electrode RFE1 through the first opening OP1 of the first insulating layer INS1. For example, the third electrode CTE1 may be in contact with the first end portion EP1 of the light emitting element LD and the first electrode RFE1.

When viewed on a plan view, the fourth electrode CTE2 may cover at least a portion of the second electrode RFE2. The fourth electrode CTE2 may be electrically connected to the second electrode RFE2 through the second opening OP2 of the first insulating layer INS1. For example, the fourth electrode CTE2 may be in contact with the second end portion EP2 of the light emitting element LD and the second electrode RFE2.

Each of the third electrode CTE1 and the fourth electrode CTE2 may include a transparent conductive material. For example, the transparent conductive material may include ITO, IZO, ITZO, and the like. When the third electrode CTE1 and the fourth electrode CTE2 include the transparent conductive material, light loss may be reduced when the light emitted from the light emitting element LD is progressed in the third direction DR3. However, the material of the third electrode CTE1 and the fourth electrode CTE2 is not limited to the materials described above.

The second insulating layer INS2 may be disposed between the third electrode CTE1 and the fourth electrode CTE2. For example, the second insulating layer INS2 may include an inorganic insulating film formed of an inorganic material. The second insulating layer INS2 may cover one of the third electrode CTE1 and the fourth electrode CTE2. Another electrode may be disposed on the second insulating layer INS2. For example, the second insulating layer INS2 may be disposed on the third electrode CTE1 to cover the third electrode CTE1, and the fourth electrode CTE2 may be disposed on the second insulating layer INS2. For example, the third electrode CTE1 and the fourth electrode CTE2 may be electrically separated by the second insulating layer INS2.

However, a disposition of the third electrode CTE1 and the fourth electrode CTE2 is not limited thereto. For example, the third electrode CTE1 and the fourth electrode CTE2 may be disposed at the same layer. In this case, the third electrode CTE1 and the fourth electrode CTE2 may be concurrently formed (e.g., substantially simultaneously formed), and formation of the second insulating layer INS2 may be omitted. Accordingly, a manufacturing process of the display device may be simplified and a manufacturing cost of the display device may be reduced.

The third insulating layer INS3 may be disposed on the third electrode CTE1, the fourth electrode CTE2, and the second insulating layer INS2. The third insulating layer INS3 may serve as an encapsulation layer that may prevent or substantially prevent the third electrode CTE1, the fourth electrode CTE2, and the light emitting element LD from being damaged in the manufacturing process of the display device and may prevent or substantially prevent oxygen and/or moisture from penetrating.

The third insulating layer INS3 may be formed of an inorganic insulating film including an inorganic material. The third insulating layer INS3 may be formed as a single layer, but is not limited thereto and may include a multi-layer structure. When the third insulating layer INS3 includes the multi-layer structure, the third insulating layer INS3 may further include an organic insulating film including an organic material, and may include a multi-layer structure in which an organic insulating film and an inorganic insulating film are alternately disposed.

The wavelength conversion layer WCL may be disposed on the third insulating layer INS3. The wavelength conversion layer WCL may include a wavelength conversion particle QD and a scattering particle SCT. The wavelength conversion layer WCL is not particularly limited as long as the wavelength conversion layer WCL has a material having a high light transmittance and excellent dispersion properties for the wavelength conversion particle QD and the scattering particle SCT. For example, the wavelength conversion layer WCL may include an organic material such as an epoxy-based resin, an acrylic-based resin, a cardo-based resin, or an imide-based resin.

The wavelength conversion particle QD may convert a peak wavelength of incident light into another specific peak wavelength. For example, the wavelength converting particle QD may convert a color of the incident light to another color.

For example, when the light emitting element LD emits blue light, the wavelength conversion particle QD may convert the blue light from the light emitting element LD into light of a different color and emit the light. For example, the wavelength converting particle QD may convert the blue light from the light emitting element LD into red light or green light and emit the red light or the green light.

One or more examples of the wavelength conversion particle QD may include a quantum dot, a quantum rod, a phosphor, or the like. The quantum dot may be a particulate material that emits light of a specific wavelength as an electron transits from a conduction band to a valence band.

Hereinafter, the wavelength conversion particle QD is described as being the quantum dot, but is not limited thereto.

The quantum dot may be a semiconductor nanocrystalline material. The quantum dot may have a specific band gap according to composition and size, and may absorb incident light, and then emit light of a unique wavelength. One or more examples of the semiconductor nanocrystal of the quantum dot may include group IV nanocrystal, group II-VI compound nanocrystal, group III-V compound nanocrystal, group IV-VI nanocrystal, or a combination thereof.

For example, an example of the group IV nanocrystal may include silicon (Si), germanium (Ge), binary compound such as silicon carbide (SiC) or silicon-germanium (SiGe), or the like, but the present disclosure is not limited thereto.

In one or more example embodiments, an example of the group II-VI compound nanocrystal may include a binary compound such as CdSe, CdTe, ZnS, ZnSe, ZnTe, ZnO, HgS, HgSe, HgTe, MgSe, MgS, and a mixture thereof, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, or a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof, but the present disclosure is not limited thereto.

In one or more example embodiments, an example of the group III-V compound nanocrystal may include a binary compound such as GaN, GaP, GaAs, GaSb, AlN, AlP, AlAs, AlSb, InN, InP, InAs, InSb, and a mixture thereof, a ternary compound such as GaNP, GaNAs, GaNSb, GaPAs, GaPSb, AlNP, AlNAs, AlNSb, AlPAs, AlPSb, InGaP, InNP, InNAs, InNSb, InPAs, InPSb, and a mixture thereof, or a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but the present disclosure is not limited thereto.

An example of the group IV-VI nanocrystal may include a binary compound such as SnS, SnSe, SnTe, PbS, PbSe, PbTe, and a mixture thereof, a ternary compound such as SnSeS, SnSeTe, SnSTe, PbSeS, PbSeTe, PbSTe, SnPbS, SnPbSe, SnPbTe, and a mixture thereof, or a quaternary compound such as SnPbSSe, SnPbSeTe, SnPbSTe, and a mixture thereof, but the present disclosure is not limited thereto.

A shape of the quantum dot is a shape generally used in the art and is not particularly limited. However, for example, the quantum dot may be spherical, pyramidal, multi-arm, or cubic nanoparticle, nanotube, nanowire, nanofiber, nanoplate-like particle, and the like. The above-described binary compound, ternary compound, or quaternary compound may be present in a particle at a uniform concentration, or may be present in the same particle by being divided into states in which concentration distributions are partially different.

The quantum dot may have a core-shell structure including a core including the nanocrystal described above and a shell surrounding the core. An interface between the core and the shell may have a concentration gradient in which a concentration of an element present in the shell decreases toward a center. The shell of the quantum dot may serve as a protective layer for maintaining semiconductor properties by preventing or substantially preventing chemical modification of the core and/or a charging layer for imparting electrophoretic properties to the quantum dot. The shell may be a single layer or multiple layers. An example of the shell of the quantum dot may include an oxide of metal or nonmetal, a semiconductor compound, or a combination thereof.

For example, an example of the oxide of metal or nonmetal may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, or $CoMn_2O_4$, but the present disclosure is not limited thereto.

In one or more example embodiments, an example of the semiconductor compound may include CdS, CdSe, CdTe, ZnS, ZnSe, ZnTe, ZnSeS, GaAs, GaP, GaSb, HgS, HgSe, HgTe, InAs, InP, InSb, AlAs, AlP, AlSb, and the like, but the present disclosure is not limited thereto.

Light emitted by the quantum dot described above may have a light emission wavelength spectrum full width of half maximum (FWHM) of about 45 nm or less, thereby improving color purity and color reproducibility of a color displayed by the display device. In one or more example embodiments, the light emitted by the quantum dot may be emitted toward various directions regardless of an incident direction of the incident light. Therefore, side visibility of the display device may be improved.

The scattering particle SCT may have a refractive index different from that of the wavelength conversion layer WCL and may form an optical interface with the wavelength conversion layer WCL. The scattering particle SCT is not particularly limited as long as the scattering particle SCT has a material capable of scattering at least some of the transmitted light. For example, the scattering particle SCT may be a particle formed of a material such as titanium oxide ($TiO_2$), aluminum oxide ($Al_2O_3$), indium oxide ($In_2O_3$), zinc oxide (ZnO), tin oxide ($SnO_2$), or silica.

The scattering particle SCT may scatter light in a random direction regardless of an incident direction of incident light without substantially converting a wavelength of light passing through the wavelength conversion layer WCL. Therefore, side visibility of the display device may be improved.

The first capping layer CPL1 may be disposed on the wavelength conversion layer WCL. The first capping layer CPL1 may be an inorganic insulating layer formed of an inorganic material. The first capping layer CPL1 may entirely cover the wavelength conversion layer WCL and may serve as an encapsulation layer preventing or substantially preventing oxygen and/or moisture from penetrating into the wavelength conversion layer WCL from the outside. Accordingly, the wavelength conversion layer WCL may be encapsulated by the third insulating layer INS3 and the first capping layer CPL1.

The color filter layer CFL may be disposed on the first capping layer CPL1. The color filter layer CFL may be an absorption type filter capable of selectively transmitting light of a specific color and absorbing light of another color to block progression.

The second capping layer CPL2 may be disposed on the color filter layer CFL. The second capping layer CPL2 may be an inorganic insulating layer formed of an inorganic material. The second capping layer CPL2 may entirely cover the color filter layer CFL to serve as an encapsulation layer preventing or substantially preventing oxygen and/or moisture from penetrating into the color filter layer CFL from the outside. Accordingly, the color filter layer CFL may be encapsulated by the first capping layer CPL1 and the second capping layer CPL2.

According to one or more example embodiments, at least one of the wavelength conversion layer WCL, the first capping layer CPL1, the color filter layer CFL, and the second capping layer CPL2 may be omitted.

The protective layer PSL may be disposed on the pixel PXL. The protective layer PSL may be an inorganic insulating layer formed of an inorganic material. The protective layer PSL may entirely cover the pixel PXL to prevent or substantially prevent the pixel PXL from being damaged due to an external foreign substance or the like. The protective layer PSL may only cover the display unit 110 in which the pixel PXL is disposed, but is not limited thereto, and may cover at least a portion of the protrusion 120.

Although not shown in the drawing, the pixel PXL may further include a partition wall surrounding each of the pixels PXL. The partition wall may be a pixel defining film to define a light emission area of the pixel PXL. The partition wall may be configured to include at least one light blocking material and/or a reflective material to prevent or substantially prevent the occurrence of a light leakage defect in which light is leaked between adjacent pixels.

In one or more example embodiments, in a process of aligning the light emitting element LD, the partition wall may prevent or substantially prevent a solution including the light emitting element LD from leaking to an adjacent pixel. In one or more example embodiments, in a process of forming the wavelength conversion layer WCL, the partition wall may prevent or substantially prevent a solution including the wavelength conversion particle QD from leaking to an adjacent pixel. The partition wall may be omitted according to process condition or the like of the display device.

Figure 13:
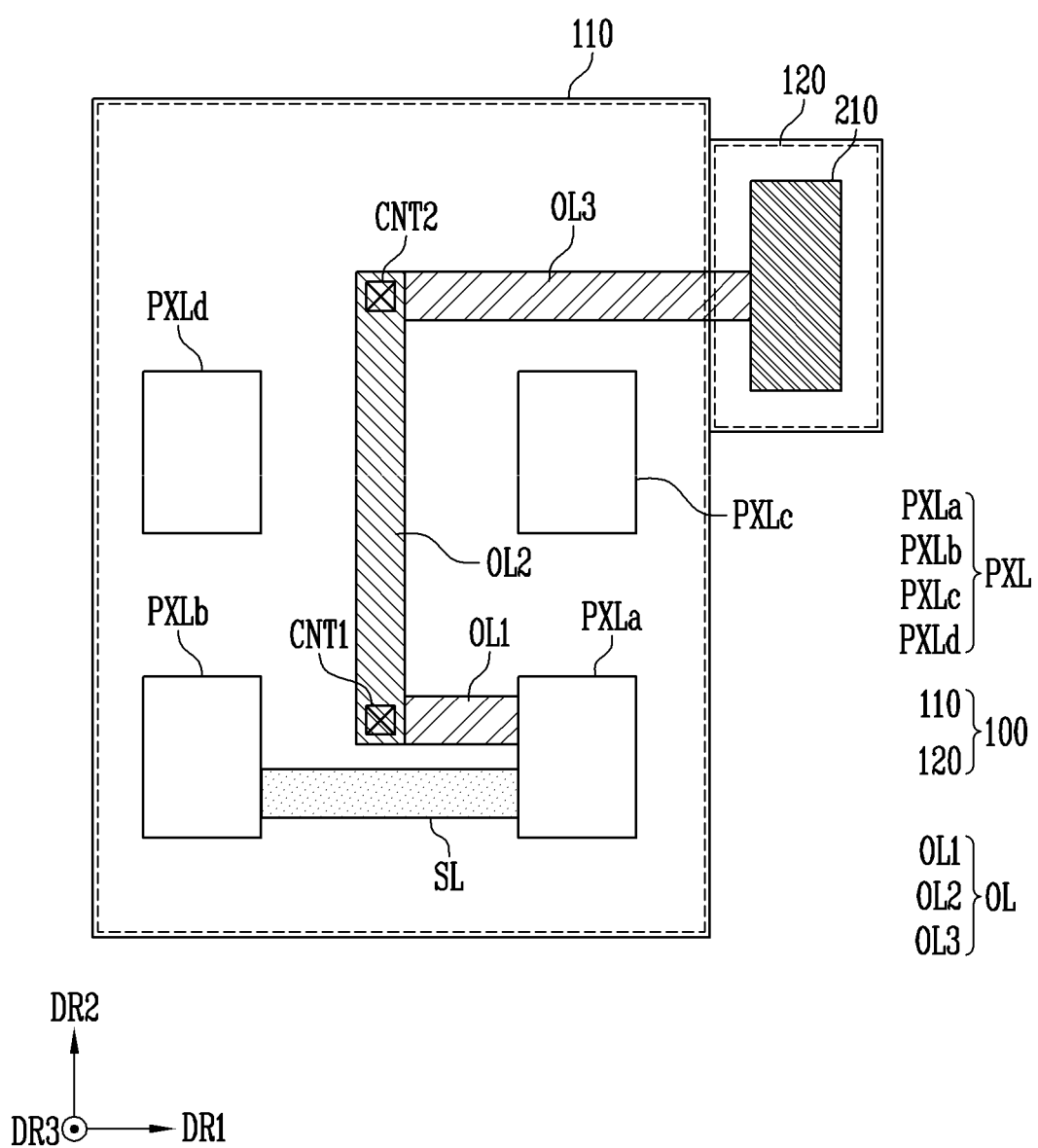
FIG. 13 is a schematic plan view for describing a structure in which the pixel and a driver included in the display device of FIG. 8 are connected through a fan-out line.

FIG. 13 is a schematic plan view for describing a structure in which the pixel and the driver included in the display device of FIG. 8 are connected through a fan-out line.

Referring to FIGS. 8 and 13, the pixels PXL may be disposed on the display unit 110 of the substrate 100, and the first driver 210 may be disposed on the protrusion 120 of the substrate 100. For convenience of description, FIG. 13 shows only one protrusion 120 protruding (or extending) in the first direction DR1 from the display 110 and one first driver 210 disposed on the protrusion 120.

The pixels PXL may include a first pixel PXLa, a second pixel PXLb, a third pixel PXLc, and a fourth pixel PXLd. Here, the first pixel PXLa and the third pixel PXLc may be pixels PXL closest to the edge of the display 110. The second pixel PXLb may be a pixel PXL positioned in the direction opposite to the first direction DR1 from the first pixel PXLa. The fourth pixel PXLd may be a pixel PXL positioned in the direction opposite to the first direction DR1 from the third pixel PXLc.

Each of the first pixel PXLa and the third pixel PXLc may be connected to the first driver 210 by a fan-out line OL. For convenience of description, FIG. 13 shows only a connection relationship between the first pixel PXLa and the first driver 210, and a connection relationship between the third pixel PXLc and the first driver 210 is omitted.

The fan-out line OL may be disposed on the display unit 110, and at least a portion of the fan-out line OL may extend toward the protrusion 120. The fan-out line OL may include a first line portion OL1, a second line portion OL2, and a third line portion OL3 electrically connected to each other.

The first line portion OL1 may be a line directly connected to the first pixel PXLa. The first line portion OL1 may be connected to the first pixel PXLa and may extend from the first pixel PXLa in the direction opposite to the first direction DR1. The first line portion OL1 may be electrically connected to the first pixel PXLa through a separate contact hole or connection member.

The second line portion OL2 may be a line connected to the first line portion OL1. The second line portion OL2 may extend from one end portion of the first line portion OL1 in the second direction DR2. The second line portion OL2 may be disposed on a layer different from that of the first line portion OL1, and may be electrically connected to the first line portion OL1 through a first contact hole CNT1 formed in an area overlapping the first line portion OL1 and the second line portion OL2.

The first line portion OL1 and the second line portion OL2 may be formed in the display unit 110. For example, the second line portion OL2 may be disposed between the first pixel PXLa disposed at the outermost region from among the pixels PXL disposed on the display unit 110, and the second pixel PXLb adjacent to the first pixel PXLa, and may be disposed between the third pixel PXLc disposed at the outermost region from among the pixels PXL disposed on the display unit 110 and the fourth pixel PXLd adjacent to the third pixel PXLc.

The third line portion OL3 may be a line connected to the second line portion OL2 and the first driver 210. The third line portion OL3 may extend from one end portion of the second line portion OL2 in the first direction DR1. The third line portion OL3 may be disposed on a layer different from that of the second line portion OL2, and may be electrically connected to the second line portion OL2 through a second contact hole CNT2 formed in an area overlapping the second line portion OL2 and the third line portion OL3. At least a portion of the third line portion OL3 may extend from the display unit 110 toward the protrusion 120, and a pad a lead for electrical contact may be provided at an end portion of the third line portion OL3 positioned on the protrusion 120.

As described above, both of the first line portion OL1 and the third line portion OL3 may be lines extending in a direction parallel to the first direction DR1, and the second line portion OL2 may be a line extending in a direction parallel to the second direction DR2 crossing the first direction DR1.

In one or more example embodiments, as described above, the second line portion OL2 may be disposed on a layer different from that of the first line portion OL1 and the third line portion OL3. For example, the first line portion OL1 and the third line portion OL3 may be disposed at the same layer, but are not limited thereto. As another example, the first line portion OL1 and the third line portion OL3 may be disposed on different layers. In such a case, all of the first line portion OL1, the second line portion OL2, and the third line portion OL3 may be disposed on different layers. Hereinafter, "formed and/or disposed at the same layer" may mean being formed in the same process and being formed of the same material.

The first driver 210 may be connected to the first pixel PXLa through the fan-out line OL. The first driver 210 may generate the first signal for driving the first pixel PXLa, and may provide the generated first signal to the first pixel PXLa through the fan-out line OL.

The first pixel PXLa and the second pixel PXLb may be electrically connected through the first signal line SL (or the scan line). The first signal line SL may be a line electrically connected to the fan-out wire OL and may extend in the same direction as the first line portion OL1 of the fan-out line OL. The second pixel PXLb may receive the first signal through the first signal line SL. The first signal line SL may be formed at the same layer as at least a portion of the fan-out line OL. For example, the first signal line SL may be formed at the same layer as the first line portion OL1, but is not limited thereto. The first signal line SL may be electrically connected to the fan-out line OL in the first pixel PXLa.

The first signal line SL may further extend in the direction opposite to the first direction DR1, and may be further connected to other pixels PXL to provide the first signal to the connected pixels PXL. For example, the first signal line SL may provide the same first signal to the pixels PXL of a pixel row in which the first pixel PXLa and the second pixel PXLb are disposed.

As described above, when the fan-out line OL connecting the first pixel PXLa disposed at the outermost portion of the display unit 110 and the first driver 210 disposed on the protrusion 120 is formed within the display unit 110 and is disposed between the pixels PXL, a space for forming the fan-out line OL around the display unit 110 may be reduced or minimized. Accordingly, the area of the display unit 110 may be secured wider, and a bezel area of the display unit 110 may be reduced or minimized.

Hereinafter, the connection relationship between the pixels PXL and the fan-out line OL will be described in more detail with reference to FIGS. 14-17 based on the content of FIG. 13.

Figure 14:
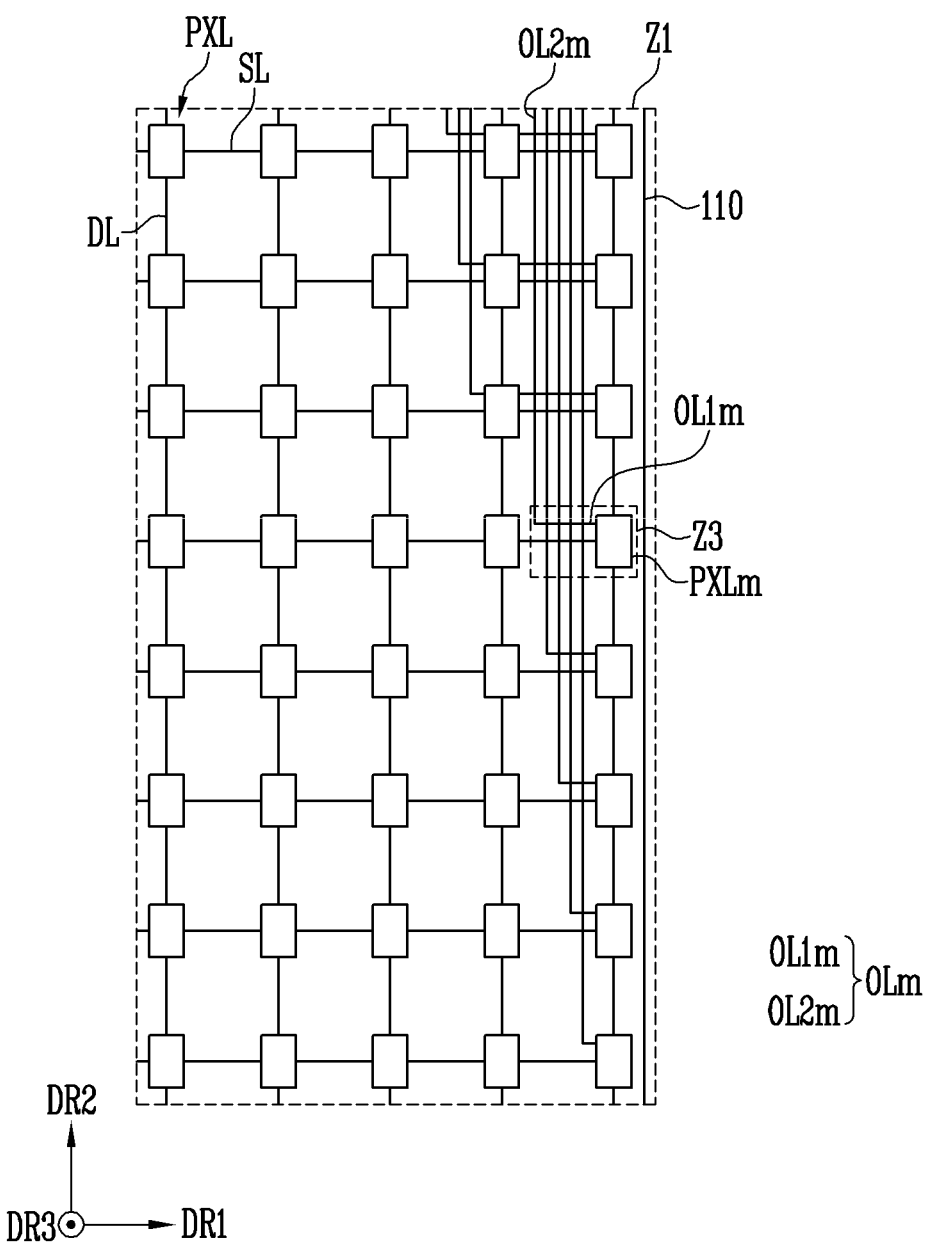
FIG. 14 is an enlarged view of a Z1 region of FIG. 8.
Figure 15:
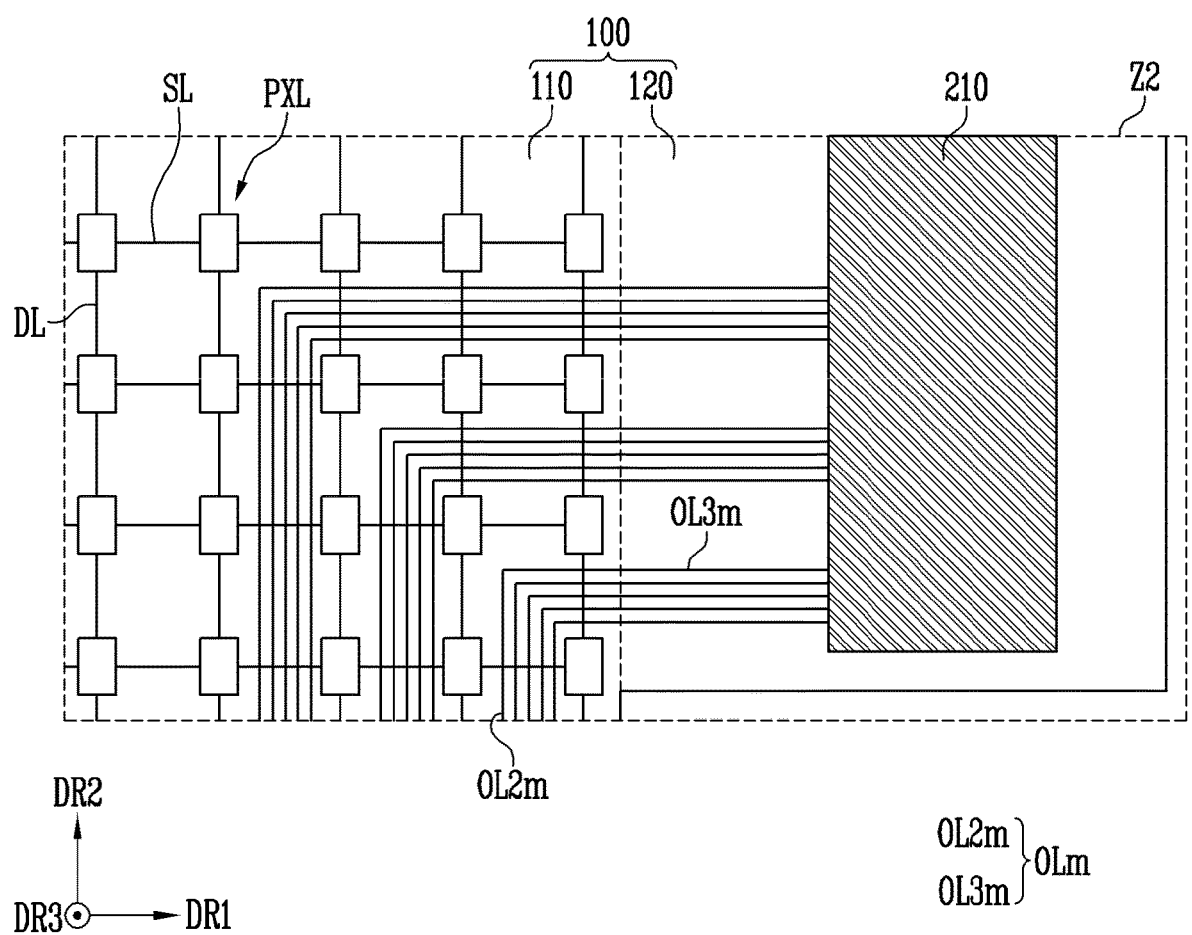
FIG. 15 is an enlarged view of a Z2 region of FIG. 8.
Figure 16:
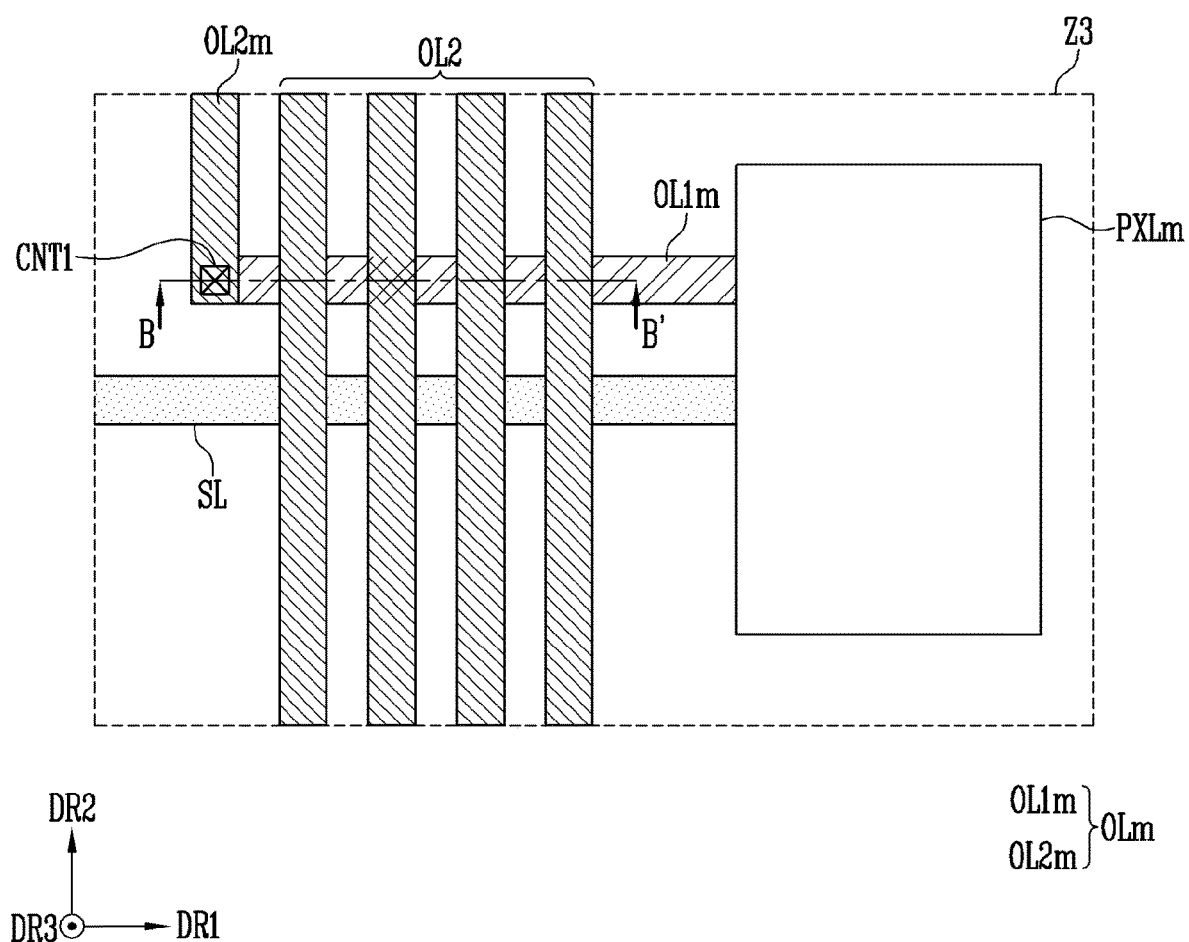
FIG. 16 is an enlarged view of a Z3 region of FIG. 14.
Figure 17:
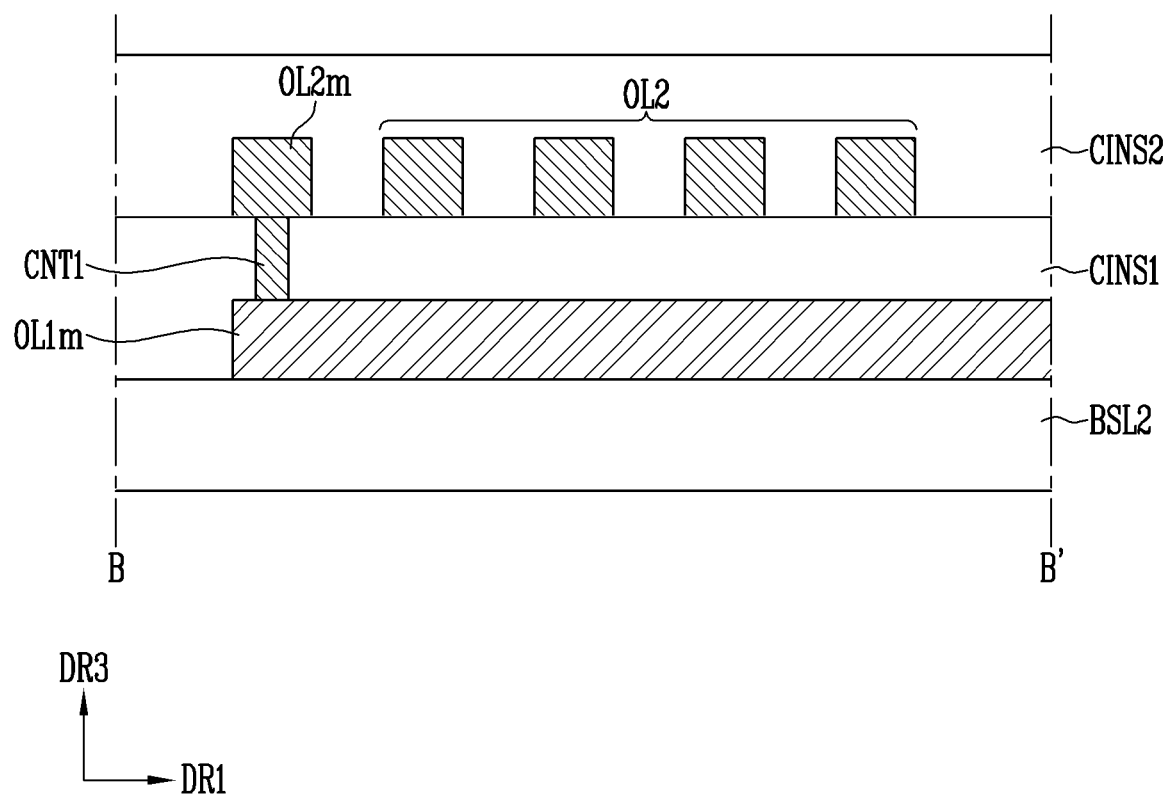
FIG. 17 is a cross-sectional view of the fan-out line taken along the line B-B' of FIG. 16.

FIG. 14 is an enlarged view of a Z1 region of FIG. 8. FIG. 15 is an enlarged view of a Z2 region of FIG. 8. FIG. 16 is an enlarged view of a Z3 region of FIG. 14. FIG. 17 is a cross-sectional view of the fan-out line taken along a line B-B' of FIG. 16.

Referring to FIGS. 14 and 15, a plurality of pixels PXL may be disposed on the display unit 110. Each of the pixels PXL may be connected to the first signal line SL (or the scan line) and the second signal line DL (or the data line) to receive the first signal (or the scan signal) and the second signal (or the data signal).

A pixel PXLm disposed at the outermost portion among the pixels PXL may be electrically connected to the first driver 210 through a fan-out line OLm. FIGS. 14 and 15 are enlarged views of the Z1 region and the Z2 region of FIG. 8 and specifically show a connection relationship between the pixel PXLm and the first driver 210. Alternatively, the outermost pixels PXL adjacent to the second driver 220 may be electrically connected to the second driver 220, and a connection relationship thereof may be substantially the same as described with reference to FIGS. 14 and 15.

The fan-out line OLm connected between the pixel PXLm and the first driver 210 may include a first line portion OL1*m*, a second line portion OL2*m*, and a third line portion OL3*m*.

Referring to FIGS. 13, 16, and 17 additionally, the first line portion OL1*m* may be a line connected to the pixel PXLm and extending along the first direction DR1. The first line portion OL1*m* may be disposed on a second base layer BSL2. The second base layer BSL2 may be one of the layers positioned on the substrate 100.

For example, the second base layer BSL2 may be an insulating layer disposed between the substrate 100 and the first base layer BSL1 of FIG. 12, but is not limited thereto.

The second line portion OL2*m* may be a line connected to the first line portion OL1*m* and extending along the second direction DR2. The second line portion OL2*m* may be positioned in the display unit 110 and may be disposed between the pixels PXL in the display unit 110.

The second line portion OL2*m* may be disposed on a layer different from that of the first line portion OL1*m*. As shown in FIG. 17, a first circuit insulating layer CINS1 may be disposed on the first line portion OL1*m*. The first circuit insulating layer CINS1 may be an inorganic insulating layer formed of an inorganic material. The first circuit insulation layer CINS1 may cover the entire first line portion OL1m, and has a first contact hole CNT1 in an area where the first line portion OL1m and the second line portion OL2m overlap. The second line portion OL2m may be electrically connected to the first line portion OL1m through the first contact hole CNT1.

Here, the second line portions OL2 electrically connected to the pixels PXL other than the pixel PXLm may be insulated from the first line portion OL1m by the first circuit insulating layer CINS1. In one or more example embodiments, although not shown in the drawing, the second line portions OL2 electrically connected to the other pixels PXL may be disposed on a layer different from that of the first signal line SL connected to the pixels PXLm and the other pixels PXL. For example, the first signal line SL may be disposed at the same layer as the first line portion OL1m, and the first circuit insulating layer CINS1 may be disposed on the first signal line SL. Accordingly, the first signal line SL may be insulated from the second line portions OL2 by the first circuit insulating layer CINS1. According to one or more example embodiments, the first signal line SL may be disposed on a layer different from that of the first line portion OL1m, but also in this case, the first signal line SL may be disposed on a layer different from that of the second line portions OL2, and the first signal line SL and the second line portions OL2 may be insulated from each other.

The third line portion OL3m may be a line connected to the second line portion OL2 and extending along the first direction DR1. The third line portion OL3m may extend from the display unit 110 to the protrusion 120 and may be connected to the first driver 210. As described with reference to FIG. 11, the third line portion OL3m may be disposed on a layer different from that of the second line portion OL2m, and may be disposed at the same layer as the first line portion OL1m. Accordingly, the first circuit insulating layer CINS1 may include a contact hole (for example, a second contact hole CNT2 of FIG. 11) in an area where the second line portion OL2m and the third line portion OL3m overlap, and the second line portion OL2m may be electrically connected to the third line portion OL3m through the contact hole.

A second circuit insulating layer CINS2 may be disposed on the fan-out line OLm. The second circuit insulating layer CINS2 may be an inorganic insulating layer formed of an inorganic material. As shown in FIG. 17, the second circuit insulating layer CINS2 may cover the second line portion OL2m and other second line portions OL2 of the fan-out line OLm, and may prevent or substantially prevent the fan-out line OLm from being damaged due to moisture and/or oxygen.

As described above, when the fan-out line OLm is disposed between the pixels PXL of the display unit 110, a separate space for the fan-out line OLm may not be provided around the display unit 110, and the area of a non-display area may be reduced or minimized. Accordingly, the display device 10 may secure a wide display area and may provide a more immersive image to the user. In other words, the display device may improve the degree of immersion into the image for the user.

Figure 18:
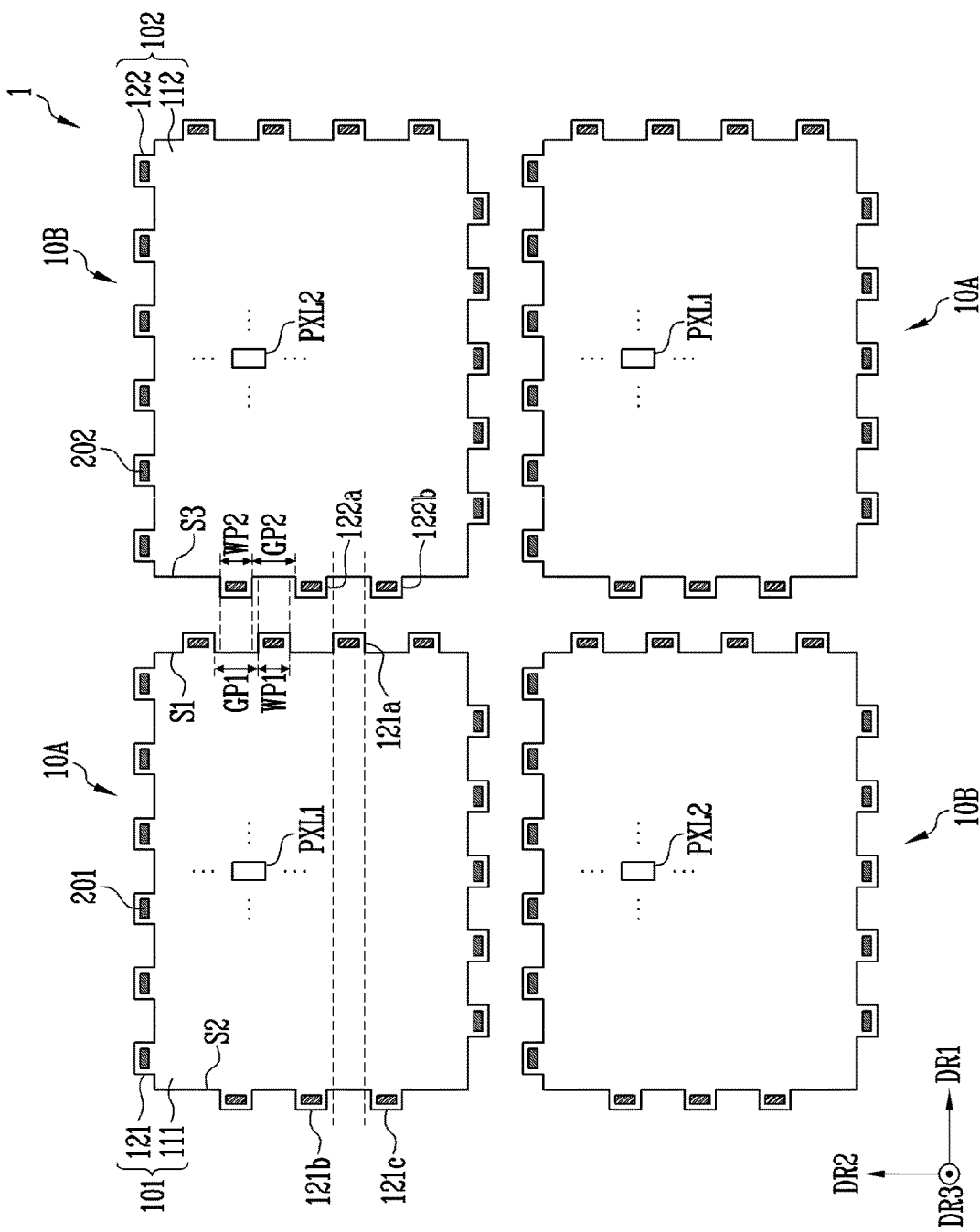
FIG. 18 is an exploded plan view of a tiled display device according to one or more example embodiments of the present disclosure.
Figure 19:
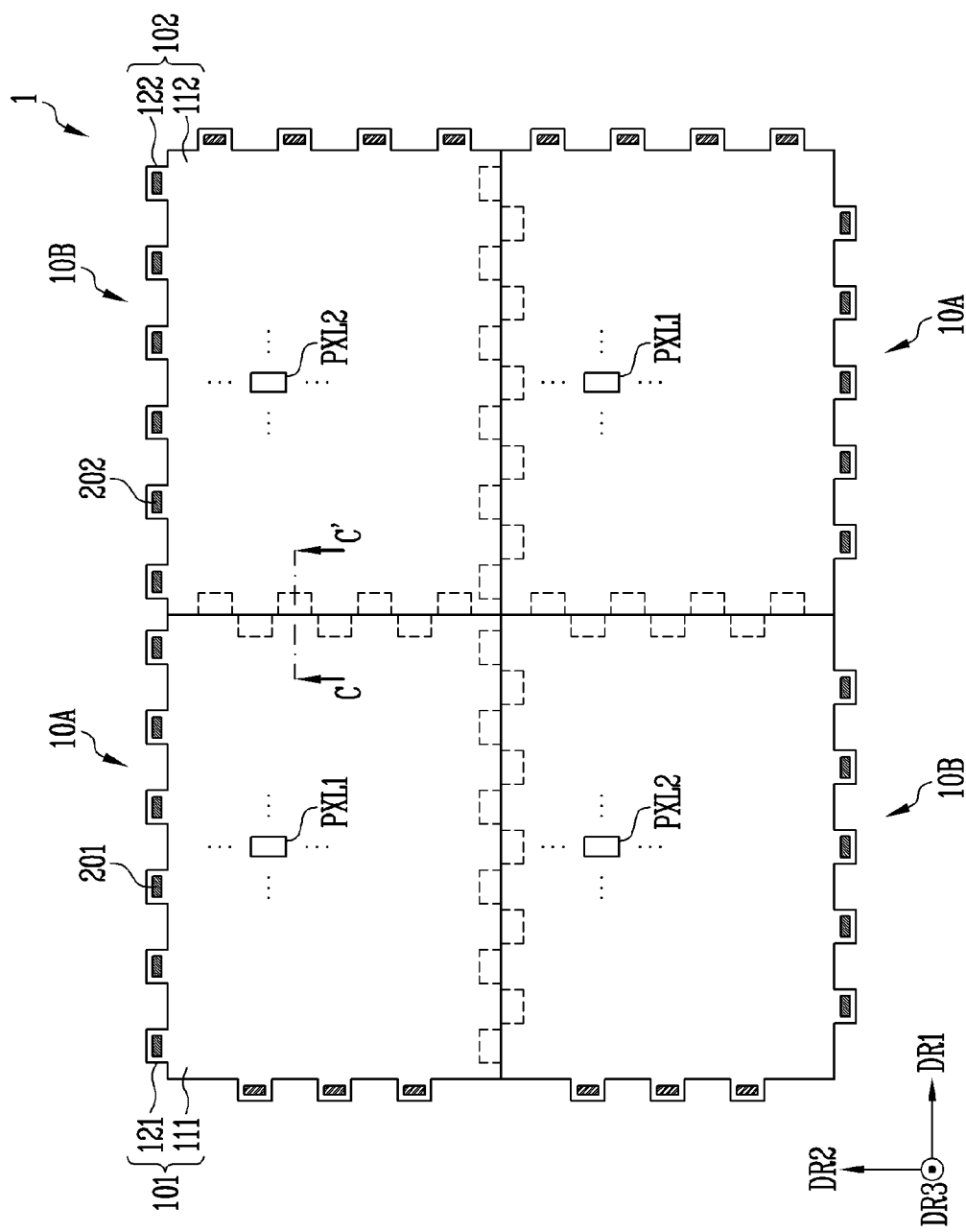
FIG. 19 is a plan view of a combined tiled display device of FIG. 18.
Figure 20:
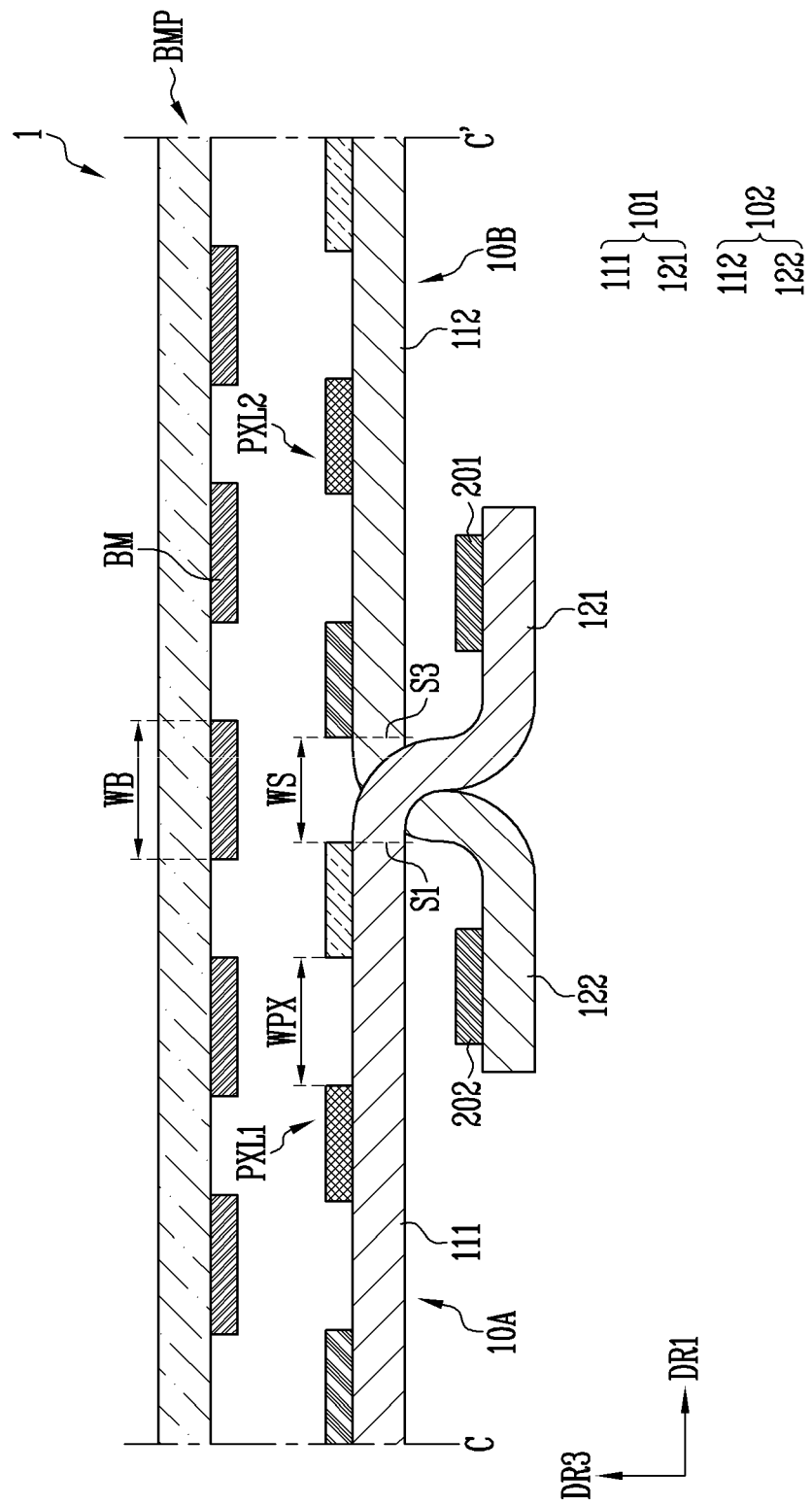
FIG. 20 is a side view of the tiled display device taken along the line C-C' of FIG. 19.

FIG. 18 is an exploded plan view of a tiled display device according to an embodiment of the disclosure. FIG. 19 is a plan view of the combined tiled display device of FIG. 18. FIG. 20 is a side view of the tiled display device taken along a line C-C' of FIG. 19.

Referring to FIG. 18, the tiled display device 1 according to one or more example embodiments of the disclosure may include a first display panel 10A and a second display panel 10B. The first display panel 10A and the second display panel 10B may be alternately arranged along the first direction DR1 and the second direction DR2. For convenience of description, FIG. 18 shows that two first display panels 10A and two second display panels 10B are alternately disposed along the first direction DR1 and the second direction DR2. However, a larger number of first display panels 10A and second display panels 10B may be alternately disposed.

Because the first display panel 10A and the second display panel 10B may be components corresponding to the display device 10 described with reference to FIGS. 8-17 above, the same or similar reference numerals are used for repetitive components, and a detailed description thereof will be omitted.

In one or more example embodiments of the disclosure, the first display panels 10A and the second display panels 10B included in the tiled display device 1 may be in close contact with each other and mounted in a chassis, or may be connected through a separate coupling means.

The first display panels 10A and the second display panels 10B may independently output different images, respectively. Alternatively, the first display panels 10A and the second display panels 10B may share one image with each other and may output one or more images divided into a plurality images.

The first display panel 10A may include a plurality of first pixels PXL1 disposed on a first display unit 111 of a first substrate 101. In one or more example embodiments, the first display panel 10A may include a plurality of first panel drivers 201 disposed on first protrusions 121 of the first substrate 101.

The second display panel 10B may include a plurality of second pixels PXL2 disposed on a display unit 112 of a second substrate 102. In one or more example embodiments, the second display panel 10B may include a plurality of second panel drivers 202 disposed on second protrusions 122 of the second substrate 102.

Each of the first protrusions 121 of the first display panel 10A may have a first width WP1 along a direction crossing a protrusion direction. In one or more example embodiments, the first protrusions 121 may be spaced from each other at a first gap GP1. Each of the second protrusions 122 of the second display panel 10B may have a second width WP2 along a direction crossing the protrusion direction. In one or more example embodiments, the second protrusions 122 may be spaced from each other at a second gap GP2. Here, the first width WP1 of the first protrusions 121 may be smaller than the second gap GP2 between the second protrusions 122, and the second width WP2 of the second protrusions 122 may be may be smaller than the first gap GP1 between the first protrusions 121.

According to one or more example embodiments, a first protrusion 121a protruding from a first side surface S1 of the first display unit 111 adjacent to the second display panel 10B may not overlap first protrusions 121b and 121c, which protrude from a second side surface S2 opposite to the first side surface S1 of the first display unit 111, in the first direction DR1.

In one or more example embodiments, in an area where the first display panel 10A and the second display panel 10B are adjacent to each other, the first protrusions 121 of the first display panel 10A and the second protrusions 122 of the second display panel 10B may be alternately positioned. For example, in the first display panel 10A and the second display panel 10B arranged side by side from the first display panel 10A in the first direction DR1, the first protrusions 121a protruding from the first side surface S1 of the first display unit 111 of the first display panel 10A may not overlap the second protrusions 122a and 122b protruding from a first side surface S3 of the adjacent second display unit 112 of the second display panel 10B in the first direction DR1. In one or more example embodiments, the first protrusion 121a and the second protrusions 122a and 122b may be alternately disposed along the second direction DR2. As described above, a width WP1 of the first protrusions 121 may be smaller than the second gap GP2 between the second protrusions 122, and the first protrusion 121a may be positioned (or overlap) in an area where the second protrusion 122 is not formed, between the second protrusions 122a and 122b.

Similarly to the above, in the first display panel 10A and the second display panel 10B adjacent from the first display panel 10A in the second direction DR2 (or the direction opposite to the second direction DR2), the first protrusions 121 and the second protrusions 122 adjacent to each other may not overlap each other in the second direction DR2, and may be alternately disposed along the first direction DR1.

According to one or more example embodiments, a shape of the first substrate 101 of the first display panel 10A may be the same as a shape of the second substrate 102 of the second display panel 10B. Accordingly, the first protrusions 121b and 121c protruding from the second side surface S2 of the first display unit 111 may overlap the second protrusions 122a and 122b, which protrude from the first side surface S3 of the second display unit 112 adjacent to the first display panel 10A, in the first direction DR1.

Referring to FIGS. 19 and 20 additionally, the first display panels 10A and the second display panels 10B arranged alternately in the first direction DR1 and the second direction DR2 may be combined in a tiled form to form one tiled display device 1.

Here, at least portions of the plurality of first protrusions 121 and second protrusions 122 positioned between the first display panels 10A and the second display panels 10B may be bent, and thus may be disposed under the second display unit 112 and the first display unit 111, respectively. For example, the first protrusions 121 protruding from a side surface adjacent to the second display panel 10B from among the plurality of first protrusions 121 may include a bent portion located under the second display unit 112; and the second protrusions 122 protruding from a side surface adjacent to the first display panel 10A from among the plurality of second protrusions 122 comprise a bent portion located under the first display unit 111.

One side surface S1 of the first display unit 111 may face one side surface S3 of the second display unit 112 in the first direction DR1. The first protrusion 121 protruding from the one side surface S1 of the first display unit 111 may be bent and disposed under the second display unit 112, and the second protrusion 122 protruding from the one side S3 of the second display unit 112 may be bent and disposed under the first display unit 111.

Accordingly, a first panel driver 201 disposed on the first protrusion 121 may be disposed under the second display unit 112, and a second panel driver 202 disposed on the second protrusion 122 may be disposed under the first display unit 111.

An area between the one side surface S1 of the first display unit 111 and the one side surface S3 of the second display unit 112 may be a seam area. The seam area is an area where the first pixel PXL1 and the second pixel PXL2 are not disposed, and may be an area where an image is not displayed.

As described above, as the first protrusion 121 and the second protrusion 122 protruding from the first display unit 111 and the second display unit 112 are bent and disposed under the adjacent display units 111 and 112, a space for disposing the first panel driver 201 and the second panel driver 202 may not be visible to the user, and a width WS of the seam area may be reduced or minimized.

For example, the width WS of the seam area may be equal to or less than a distance between the first pixels PXL1 or the second pixels PXL2. For example, the width WS of the seam area in the first direction DR1 is equal to or less than a pixel distance WPX between the first pixels PXL1 of the first display panel 10A. As the width WS of the seam area is reduced or minimized, the tiled display device 1 in which the plurality of first display panels 10A and second display panels 10B are arranged may be recognized as one panel other than separate display panels, and may provide a more immersive image to the user.

According to one or more example embodiments, the tiled display device 1 may further include a black matrix panel BMP disposed on the first display panels 10A and the second display panels 10B.

The black matrix panel BMP may include a black matrix BM extending along the first direction DR1 or the second direction DR2 on a plane. The black matrix BM may be disposed along a boundary between the first pixels PXL1 and the second pixels PXL2 disposed on the first display unit 111 and the second display unit 112. In one or more example embodiments, the black matrix BM may be disposed to overlap the seam area between the first display unit 111 and the second display unit 112.

A width WB of the black matrix BM may be greater than the pixel distance WPX between the first pixels PXL1 or the second pixels PXL2. In one or more example embodiments, the width WB of the black matrix BM may be greater than the width WS of the seam area, but is not limited thereto.

The black matrix BM may be disposed at a regular distance, and light emitted from the pixels PXL1 and PXL2 may be emitted at a regular interval. The black matrix BM may absorb light progressing toward an adjacent pixel from among light emitted from the pixels PXL1 and PLX2 to block light from being emitted. Accordingly, a light leakage defect that occurs between adjacent pixels may be improved.

In one or more example embodiments, as the black matrix BM is formed to overlap the seam area between the first display panel 10A and the second display panel 10B, light reflected by the seam area may be prevented or substantially prevented from being viewed to the user. For example, the black matrix BM may prevent or substantially prevent the seam area from being viewed to the user. Accordingly, the tiled display device 1 may provide a more immersive image to the user.

FIG. 21 is an exploded plan view of a tiled display device according to another example embodiment of the disclosure. The embodiment of FIG. 21 is different from the embodiment of FIGS. 18 and 19 in that the embodiment of FIG. 21 includes a first display panel 10C and a second display panel 10D of which shapes are different from each other. In the example embodiment of FIG. 21, the first display panel 10C and the second display panel 10D may include protrusions overlapping each other along the first direction DR1 and the second direction DR2, respectively. However, also in this case, the first protrusions 121 of the first display panel 10C may not overlap the second protrusions 122 of the second display panel 10D. Hereinafter, differences from the embodiment of FIGS. 18 and 19 will be mainly described, and repetitive description will be omitted.

For example, referring to FIG. 21, the tiled display device 2 according to another example embodiment of the disclosure may include the first display panel 10C and the second display panel 10D. The first display panel 10C and the second display panel 10D may be alternately arranged along the first direction DR1 and the second direction DR2.

The first display panel 10C may include a plurality of first pixels PXL1 disposed on the first display unit 111 of the first substrate 101. In one or more example embodiments, the first display panel 10C may include a plurality of first panel drivers 201 disposed on the first protrusions 121 of the first substrate 101.

The second display panel 10D may include a plurality of second pixels PXL2 disposed on the display unit 112 of the second substrate 102. In one or more example embodiments, the second display panel 10D may include a plurality of second panel drivers 202 disposed on the second protrusions 122 of the second substrate 102.

The first protrusions 121 may be spaced from each other at a first gap GP1. A second width WP2 of each of the second protrusions 122 may be smaller than the first gap GP1 between the first protrusions 121.

According to one or more example embodiments, a first protrusion 121d protruding from one side surface of the first display 111 adjacent to the second display panel 10D may overlap a first protrusion 121e protruding from another side surface of the first display unit 111, which faces the one side surface of the first display unit 111, in the first direction DR1.

In one or more example embodiments, in an area where the first display panel 10C and the second display panel 10D are adjacent to each other, the first protrusions 121 of the first display panel 10C and the second protrusions 122 of the second display panel 10D may be alternately positioned. For example, in the first display panel 10C and the second display panel 10D arranged side by side from the first display panel 10C in the first direction DR1, the first protrusions 121d protruding from the first side surface of the first display unit 111 may not overlap second protrusions 122c and 122d protruding from the one side surface of the adjacent second display unit 112 in the first direction DR1. In one or more example embodiments, the first protrusion 121d and the second protrusions 122c and 122d may be alternately disposed along the second direction DR2. The first protrusion 121d may be positioned (or overlap) in an area where the second protrusion 122 is not formed, between the second protrusions 122c and 122d.

Similarly to the above, in the first display panel 10C and the second display panel 10D adjacent from the first display panel 10C in the second direction DR2 (or the direction opposite to the second direction DR2), the first protrusions 121 and the second protrusions 122 adjacent to each other may not overlap each other in the second direction DR2, and may be alternately disposed along the first direction DR1.

Similarly to that described in the embodiment of FIGS. 19 and 20, the first display panel 10C and the second display panel 10D of the tiled display device 2 may be assembled in close contact with each other. Accordingly, the first protrusions 121 of the first display panel 10C may be bent and disposed under the second display unit 112 of the second display panel 10D. In one or more example embodiments, the second protrusions 122 of the second display panel 10D may be bent and disposed under the first display unit 111 of the first display panel 10C. Accordingly, the tiled display device 2 may reduce or minimize the seam area between the first display panel 10C and the second display panel 10D, and may provide a more immersive image to the user. In other words, the tiled display device 2 may provide an improved degree of immersion into the image to the user.

Although the embodiments of the disclosure have been described with reference to the accompanying drawings, it will be understood by those skilled in the art to which the disclosure pertains that the embodiments may be implemented in other specific forms without changing the technical spirit and essential features of the disclosure. Therefore, it should be understood that the embodiments described above are illustrative and are not restrictive in any aspects.

What is claimed is:

1. A display device comprising:
   a substrate comprising a display unit comprising a plurality of pixels and a protrusion protruding from an edge of the display unit, the plurality of pixels comprising a first pixel on an outermost region of the display unit and a second pixel adjacent to the first pixel;
   a driver on the protrusion; and
   a fan-out line to electrically connect the first pixel and the driver,
   wherein at least a portion of the fan-out line is on the display unit between the first pixel and the second pixel in a plan view.

2. The display device according to claim 1, wherein the fan-out line comprises:
   a first line portion connected to the first pixel;
   a second line portion connected to the first line portion and located between the first pixel and the second pixel; and
   a third line portion connected to the second line portion and the driver.

3. The display device according to claim 2, wherein the driver is configured to provide a first signal to the first pixel through the fan-out line, and
   wherein the first pixel is connected to the second pixel through a first signal line, and the second pixel is configured to receive the first signal through the first signal line.

4. The display device according to claim 3, wherein the first line portion and the third line portion extend in a same direction as the first signal line.

5. The display device according to claim 3, wherein the driver comprises a scan driver or a data driver, and
   the first pixel is configured to emit light according to the first signal from the driver.

6. The display device according to claim 2, wherein the first line portion and the third line portion are at a same layer, and
   the second line portion is at a layer different from the first line portion and the third line portion.

7. The display device according to claim 6, further comprising:
   an insulating layer on the first line portion and the third line portion,
   wherein the second line portion is on the insulating layer.

8. The display device according to claim 7, wherein the insulating layer includes a first contact hole exposing at least a portion of the first line portion and a second contact hole exposing at least a portion of the third line portion, and
   wherein the second line portion is connected to the first line portion through the first contact hole, and is connected to the third line portion through the second contact hole.

9. The display device according to claim 1, wherein each of the pixels comprises:

a first electrode and a second electrode located at a same layer and spaced from each other; and a light emitting element located between the first electrode and the second electrode.

10. The display device according to claim 9, wherein the pixels further comprises:

a wavelength conversion layer on the light emitting element; and a color filter layer on the wavelength conversion layer, wherein the wavelength conversion layer comprises a wavelength conversion particle and a scattering particle.

11. A tiled display device comprising:

first display panels and second display panels arranged alternately with each other in a first direction and a second direction crossing the first direction, wherein each of the first display panels comprises:

a first substrate comprising a first display unit and a plurality of first protrusions protruding from an edge of the first display unit, the plurality of first protrusions being spaced at a first distance from each other;

a first pixel in the first display unit;

first panel drivers at the first protrusions; and a first fan-out line located in the first display unit to electrically connect the first pixel and one of the first panel drivers, wherein each of the second display panels comprises:

a second substrate comprising a second display unit and a plurality of second protrusions protruding from an edge of the second display unit, the plurality of second protrusions being spaced at a second distance from each other;

a second pixel in the second display unit;

second panel drivers at the second protrusions; and a second fan-out line located in the second display unit to electrically connect the second pixel and one of the second panel drivers, wherein the first protrusions protruding from a side surface of the edge of the corresponding first display unit adjacent to each of the second display panels from among the plurality of first protrusions comprise a bent portion located under the second display unit; and the second protrusions protruding from a side surface of the edge of the corresponding second display unit adjacent to each of the first display panels from among the plurality of second protrusions comprise a bent portion located under the first display unit.

12. The tiled display device according to claim 11, wherein each of the first display panels further comprises a third pixel located in the first display unit, wherein the first fan-out line comprises:

a first line portion connected to the first pixel;

a second line portion connected to the first line portion and located between the first pixel and the third pixel; and a third line portion connected to the second line portion and one of the first panel drivers.

13. The tiled display device according to claim 12, wherein a first panel driver from among the first panel drivers is configured to provide a first signal to the first pixel through the first fan-out line, and wherein the first pixel is connected to the third pixel through a first signal line, and is configured to transfer the first signal to the third pixel through the first signal line.

14. The tiled display device according to claim 12, wherein the first line portion and the third line portion are at a same layer, and the second line portion is at a layer different from the first line portion and the third line portion.

15. The tiled display device according to claim 11, wherein each of the first pixel and the second pixel comprises:

a first electrode and a second electrode located at a same layer and spaced from each other; and a light emitting element located between the first electrode and the second electrode.

16. The tiled display device according to claim 11, further comprising:

a black matrix panel on each of the first display panels and the second display panels, wherein the black matrix panel comprises a black matrix overlapping a seam area between the first display unit and the second display unit in a third direction crossing the first direction and the second direction, and wherein a width of the black matrix is greater than a width of the seam area.

17. The tiled display device according to claim 11, wherein the first substrate comprises a first side surface and a second side surface opposite to each other in the first direction, wherein the first protrusions protruding from the first side surface do not overlap the first protrusions protruding from the second side surface, in the first direction, wherein the second substrate comprises a third side surface adjacent to the first side surface of the first substrate and opposite to the first side surface in the first direction, and wherein the second protrusions protruding from the third side surface do not overlap the first protrusions protruding from the first side surface, in the first direction.

18. The tiled display device according to claim 17, wherein a shape of the second substrate of each of the second display panels is same as a shape of the first substrate of each of the first display panels.

19. The tiled display device according to claim 11, wherein the first substrate comprises a first side surface and a second side surface opposite to each other in the first direction, wherein the first protrusions protruding from the first side surface overlap the first protrusions protruding from the second side surface, in the first direction, wherein the second substrate comprises a third side surface adjacent to the first side surface and opposite to the first side surface in the first direction, and wherein the second protrusions protruding from the third side surface do not overlap the first protrusions protruding from the first side surface, in the first direction.

20. The tiled display device according to claim 11, wherein a gap between the first protrusions is greater than a width of each of the second protrusions, and wherein a gap between the second protrusions is greater than a width of each of the first protrusions.

* * * * *